US012764907B2

(12) United States Patent
Nasr et al.

(10) Patent No.: US 12,764,907 B2
(45) Date of Patent: Oct. 13, 2026

(54) COLD PLATE WITH INTEGRATED SLIDING PEDESTAL AND PROCESSING SYSTEM INCLUDING THE SAME

(71) Applicant: Tesla, Inc., Austin, TX (US)

(72) Inventors: Mohamed Haitham Helmy Nasr, Sunnyvale, CA (US); Aydin Nabovati, Toronto (CA); Aldrich Chester L. Ong, Sacramento, CA (US); Jeffrey John Miller, Sunnyvale, CA (US)

(73) Assignee: Tesla, Inc., Austin, TX (US)

( * ) Notice: Subject to any disclaimer, the term of this patent is extended or adjusted under 35 U.S.C. 154(b) by 314 days.

(21) Appl. No.: 18/549,342

(22) PCT Filed: Mar. 1, 2022

(86) PCT No.: PCT/US2022/018277
§ 371 (c)(1),
(2) Date: Sep. 6, 2023

(87) PCT Pub. No.: WO2022/192031
PCT Pub. Date: Sep. 15, 2022

(65) Prior Publication Data

US 2024/0314980 A1 Sep. 19, 2024

Related U.S. Application Data

(60) Provisional application No. 63/158,260, filed on Mar. 8, 2021.

(51) Int. Cl.
*H05K 7/20* (2006.01)
*H05K 1/02* (2006.01)

(52) U.S. Cl.
CPC ....... *H05K 7/20454* (2013.01); *H05K 1/0203* (2013.01); *H05K 7/20254* (2013.01); *H05K 7/20272* (2013.01)

(58) Field of Classification Search
CPC ............... H01L 23/433; H01L 23/4332; H01L 23/4334; H01L 23/4336; H01L 23/4338
See application file for complete search history.

(56) References Cited

U.S. PATENT DOCUMENTS 5,000,256 A * 3/1991 Tousignant ............. H01L 23/42 165/104.19
5,050,037 A * 9/1991 Yamamoto .......... H01L 23/4735 257/E23.091

(Continued)

FOREIGN PATENT DOCUMENTS

| | | |
|---|---|---|
| CN | 107852842 | 3/2018 |
| JP | 08-139237 | 5/1996 |

(Continued)

OTHER PUBLICATIONS

International Search Report and Written Opinion dated Jun. 3, 2022 in application No. PCT/US2022/018277.

*Primary Examiner* — Adam B Dravininkas
(74) *Attorney, Agent, or Firm* — Knobbe, Martens, Olson & Bear, LLP

(57) ABSTRACT

A cold plate with an integrated sliding pedestal and a processing system including the same are provided. In one aspect, the processing system includes a printed circuit board (PCB), a first electronic component arranged over the PCB, and a thermal interface material (TIM) arranged over the first electronic component. The system includes at least one sliding pedestal arranged over the TIM. The sliding pedestal is configured to be spaced a variable distance from the PCB. The system also includes a cold plate arranged over the sliding pedestal and configured to provide a coolant to the sliding pedestal and to cool a second electronic component.

19 Claims, 20 Drawing Sheets

(56) References Cited

U.S. PATENT DOCUMENTS

| | | | | |
|---|---|---|---|---|
| 5,264,984 | A * | 11/1993 | Akamatsu | H01L 23/4336 361/689 |
| 5,420,753 | A * | 5/1995 | Akamatsu | H01L 23/433 257/713 |
| 8,111,516 | B2 | 2/2012 | Goldrian et al. | |
| 2007/0091569 | A1 * | 4/2007 | Campbell | H01L 23/4338 361/699 |
| 2009/0213541 | A1 * | 8/2009 | Butterbaugh | H01L 23/473 361/689 |
| 2013/0208422 | A1 * | 8/2013 | Hughes | H05K 7/20318 361/700 |
| 2014/0254098 | A1 * | 9/2014 | Arvelo | F28D 15/00 361/699 |
| 2015/0131224 | A1 * | 5/2015 | Barina | G06F 1/20 361/679.53 |
| 2016/0150678 | A1 | 5/2016 | Kim | |
| 2017/0027083 | A1 * | 1/2017 | Bai | H05K 7/20672 |
| 2017/0105320 | A1 | 4/2017 | Park | |
| 2017/0221793 | A1 | 8/2017 | Smalley et al. | |
| 2019/0132938 | A1 | 5/2019 | Mira et al. | |
| 2020/0045850 | A1 * | 2/2020 | Bala | H05K 7/20436 |
| 2021/0183742 | A1 * | 6/2021 | Sri-Jayantha | H01L 23/4332 |

FOREIGN PATENT DOCUMENTS

| | | |
|---|---|---|
| JP | 2011-129739 | 6/2011 |
| JP | 2011-258655 | 12/2011 |
| JP | 2014-192409 | 10/2014 |
| TW | 201921225 | 6/2019 |

* cited by examiner

COLD PLATE WITH INTEGRATED SLIDING PEDESTAL AND PROCESSING SYSTEM INCLUDING THE SAME

CROSS-REFERENCE TO RELATED APPLICATION

This application is a U.S. national phase application under 35 U.S.C. § 371 of International Application No. PCT/US2022/018277, titled "COLD PLATE WITH INTEGRATED SLIDING PEDESTAL AND PROCESSING SYSTEM INCLUDING THE SAME," and filed Mar. 1, 2022, which claims the benefit of U.S. Provisional Patent Application No. 63/158,260, titled "COLD PLATE WITH INTEGRATED SLIDING PEDESTAL AND PROCESSING SYSTEM INCLUDING THE SAME," filed Mar. 8, 2021, the disclosures of each which are incorporated herein by reference in its entirety their entireties and for all purposes.

BACKGROUND

Technical Field

The present disclosure relates generally to cooling components, and more specifically to cooling one or more electronic components.

Description of the Related Technology

Processing systems can include a plurality of components such as a system on chip (SOC), an application-specific integrated circuit (ASIC), etc. Such components generate heat when in operation, such that cooling the components can improve the performance of the components and/or enable the components to operate in high temperature environment without failure. Thus, it can be desirable to provide cooling to one or more of the components within a processing system to improve the overall performance of the processing system.

SUMMARY OF CERTAIN INVENTIVE ASPECTS

In one aspect, there is provided a processing system, comprising: a first electronic component arranged over a printed circuit board (PCB), the first electronic component having a height in a first direction perpendicular to a major surface of the PCB; a thermal interface material (TIM) layer arranged over the first electronic component; a sliding pedestal arranged over the TIM layer, wherein the sliding pedestal is configured to be spaced a variable distance in the first direction from the PCB; and a cold plate arranged over the sliding pedestal, the cold plate configured to cool a second electronic component and provide a coolant to the sliding pedestal to cool the first electronic component via the sliding pedestal and the TIM layer.

In some embodiments, the sliding pedestal comprises: an inlet configured to receive the coolant from the cold plate; an outlet configured to return the coolant to the cold plate; and a fin array arranged between the inlet and the outlet and configured to provide heat transfer between the coolant and the first electronic component for cooling the first electronic component.

In some embodiments, the processing system further comprises a pair of O-rings configured to maintain a fluid seal between the sliding pedestal and the cold plate as the sliding pedestal moves in the first direction.

In some embodiments, the processing system further comprises a second PCB arranged over the cold plate, wherein the second electronic component is arranged between the second PCB and the cold plate, and wherein the second electronic component having a second height in the first direction.

In some embodiments, the cold plate comprises a fin array configured to cool the second electronic component.

In some embodiments, the processing system further comprises: a second sliding pedestal arranged between the cold plate and the second electronic component, wherein the second sliding pedestal is configured to be spaced a second variable distance in the first direction from the second PCB.

In some embodiments, the first electronic component comprises a first processor chip, the processing system further comprising: a second processor chip arranged over the PCB, the second processor chip having a second height in the first direction; a second TIM layer arranged over the second processor chip; and a second sliding pedestal arranged over the second TIM layer, wherein the second sliding pedestal is configured to be spaced a second variable distance in the first direction from the PCB.

In some embodiments, the cold plate comprises a manifold that defines a path through which the coolant is configured to flow, the manifold comprising: an inlet configured to receive the coolant; a split in the path configured to route the flow of the coolant into each of the sliding pedestal and the second sliding pedestal; and an outlet through which the coolant is configured to exit the cold plate.

In some embodiments, the processing system of claim 8, further comprises: a third electronic component arranged over the PCB; and a third TIM layer arranged over the second electronic component, wherein the cold plate further comprises a fixed gap pedestal arranged over the third TIM layer, and wherein the manifold is further configured to direct the coolant to flow over the fixed gap pedestal so as to cool the second electronic component.

In some embodiments, the first electronic component comprises a first processor chip, the processing system further comprising: a spring loaded back plate arranged below the PCB, the spring loaded back plate configured to pull the processor chip towards the PCB.

In some embodiments, the sliding pedestal comprises: a pedestal body; a fin array enclosed within the pedestal body; and a bypass seal configured to guide flow of the coolant through the fin array.

In some embodiments, the sliding pedestal further comprises: a fin lid configured to secure the fin array within the pedestal body; and a pair of O-rings configured to seal the sliding pedestal to the cold plate.

In some embodiments, the cold plate comprises a cylinder configured to receive a portion of the sliding pedestal.

Another aspect is a system for cooling at least one integrated circuit die, comprising: a sliding pedestal dimensioned to cover an integrated circuit die arranged over a printed circuit board (PCB), the sliding pedestal comprising an inlet to receive a coolant and an outlet to output the coolant, wherein the sliding pedestal is movable to adjust a distance between the sliding pedestal and the integrated circuit die; and a cold plate connectable with the sliding pedestal, the cold plate configured to provide the coolant to the sliding pedestal for cooling the integrated circuit die and to cool an electronic component.

In some embodiments, the system further comprises: a second sliding pedestal dimensioned to cover a second integrated circuit die, the second sliding pedestal comprising an inlet to receive the coolant and an outlet to output the coolant, wherein the second sliding pedestal is movable to adjust a distance between the second sliding pedestal and the second integrated circuit die, wherein the cold plate is further connectable with the second sliding pedestal, and the cold plate is further configured to provide the coolant to the second sliding pedestal for cooling the second integrated circuit die.

In some embodiments, the cold plate comprises: a manifold that defines a path through which the coolant is configured to flow, the manifold comprising: an inlet configured to receive the coolant, a split in the path configured to route the flow of the coolant into each of the sliding pedestal and second sliding pedestal, and an outlet through which the coolant is configured to exit the cold plate. The cold plate can include fixed gap pedestals used for cooling other electronics on the printed circuit boards. These fixed gap pedestals can be part of the cold plate structure or mechanically attached by brazing, gluing, etc.

In some embodiments, the manifold further comprises fin structures configured to cool electronics on one or more printed circuit boards.

In some embodiments, the sliding pedestal and the second sliding pedestal are arranged on opposing sides of the cold plate.

In some embodiments, the sliding pedestal and the second sliding pedestal are arranged on a same side of the cold plate.

Yet another aspect is a method of manufacture, comprising: providing a sliding pedestal over an integrated circuit (IC) die on a printed circuit board (PCB) with a thermal interface material (TIM) layer positioned between the IC die and the sliding pedestal; and attaching a spring loaded back plate to secure the sliding pedestal over the IC die, wherein the sliding pedestal is configured to be spaced a variable distance in the first direction from the PCB after said attaching.

In some embodiments, the method further comprises: providing O-rings at an inlet and an outlet of the sliding pedestal; and connecting the inlet and the outlet of the sliding pedestal to a cold plate with the sliding pedestal arranged between the cold plate and the PCB.

In some embodiments, the sliding pedestal is configured to receive coolant at an inlet and output the coolant at an outlet.

DETAILED DESCRIPTION

Figure 1:
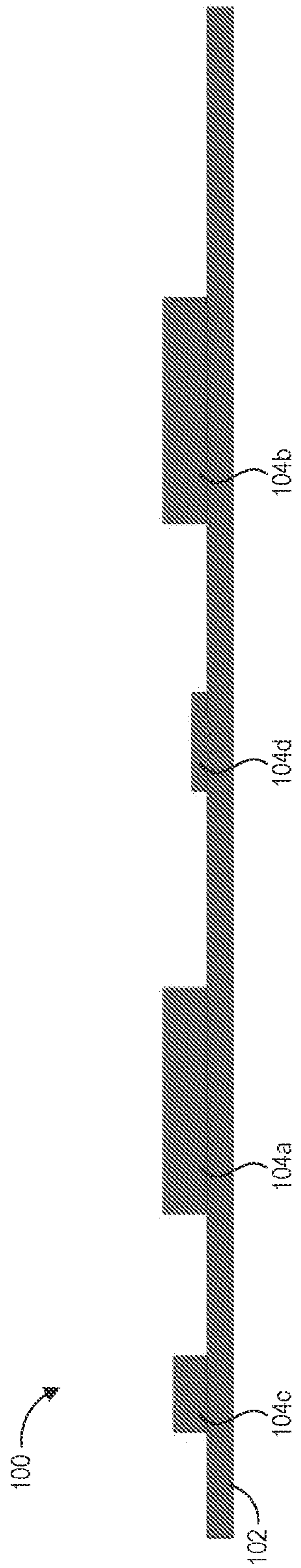
FIG. 1 is a cross-sectional view of a partially assembled processing system in accordance with aspects of this disclosure.

The following detailed description of certain embodiments presents various descriptions of specific embodiments. However, the innovations described herein can be embodied in a multitude of different ways, for example, as defined and covered by the claims. In this description, reference is made to the drawings where like reference numerals and/or terms can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

One significant design consideration for processing systems (e.g., a multi-chip module, integrated circuit assembly, etc.) is the cooling of electronic components positioned on one or more printed circuit boards (PCBs). In particular, electronic components may operate most efficiently within a given temperature range. Accordingly, any heat generated by an electronic component may increase the temperature of the electronic component above the temperature range for most efficient operation, leading to a decrease in performance, and at worst case, shutdown. Cooling is typically needed to maintain the temperature of the electronic components within or closer to a desired temperature range, thereby improving performance of the processing system.

Aspects of this disclosure relate to a cooling system design that can include a two-sided cold plate with sliding pedestals (also referred to as “floating” pedestals) on one or both sides of the cold plate. Two printed circuit board assemblies (PCBAs) can be installed on opposing sides of the cold plate. The sliding pedestals allow for the use of a reduced thermal resistance path to the main heat dissipating components on either of the PCBAs. In this design, the bulk or body of the cold plate may serve multiple purposes including: (i) acting as a manifold to distribute coolant flow to the sliding pedestals as desired per pedestal, (ii) having a tunable density of internal fins to cool the rest of heat dissipating components on the PCBAs that are not cooled by the sliding pedestals, and (iii) attaching to the cooled PCBAs mechanically and rigidly supporting them from flexure. The manifold is also a reliable method of routing as compared to flexible hoses, which are typically used in industry, and enables a lower system pressure drop which produces a higher coefficient of performance for the system.

The sliding pedestals can be used to cool one or more relatively high power electronic components of the processing system via cooling channels. The one or more electronic components can include a processor or other integrated circuit die. The sliding pedestals have the flexibility to move vertically while maintaining a fluid seal between the cold plate body and the sliding pedestals. The sliding pedestals can provide a relatively low impedance thermal interface with high power electronic components, which can result in increased cooling capacity and better performance. The low impedance thermal interface can be achieved by compressing the thermal interface material between the sliding pedestal and the high power ASIC with a spring loaded clip attached to the back of the PCB.

Further aspects of this disclosure provide a cooling solution for one or more PCBAs which can provide varying levels of cooling efficiency for reliable operation with a single cooling solution in a compact space. Such aspects can address the technical challenge of performance limitations due to thermal interface impedance for high power density chips where there is insufficient space and/or prohibitive costs for a dedicated cooling solution.

FIG. 1 is a cross-sectional view of a partially assembled processing system 100 in accordance with aspects of this disclosure. As shown in FIG. 1, the processing system 100 includes a PCB 102 onto which a plurality of electronic components 104*a*-104*d* are placed. In one example, the electronic components 104*a*-104*d* include two high power processors 104*a* and 104*b* as well as two other electric components 104*c* and 104*c*. In some applications, the high power processors 104*a* and 104*b* may be configured to execute at least a part of computations associated with autopilot (AP) driving, other autonomous vehicle functionality, Advanced Driving Assistance System (ADAS) functionality, or an infotainment system of a vehicle. However, aspects of this disclosure are not limited thereto and the electronic components 104*a*-104*d* may be configured to perform various functions depending on the particular application.

In a variety of applications, it can be desirable to provide cooling to one or more of the electronic components 104*a*-104*d* in order to improve the performance of the electronic components 104A-104*d* and allow them to operate in high-temperature environment with higher reliability. Due to the design of the individual electronic components 104*a*-104*d*, the electronic components 104*a*-104*d* may have different heights, and, thus, extend different distances from the PCB 102 in the Z-direction (e.g., a direction perpendicular to a major surface of the PCB 102 or a plane defined by the PCB 102). In addition to differences in the heights of the electronic components 104*a*-104*d* due to the use of different components (e.g., high power processors 104*a* and 104*b* and other electric components 104*c* and 104*c*), there may also be variations in the heights of the same type of electronic components 104*a*-104*d*, for example, due to the tolerances in the electronic components 104*a*-104*d* themselves and any other materials used the cooling solution.

Figure 2:
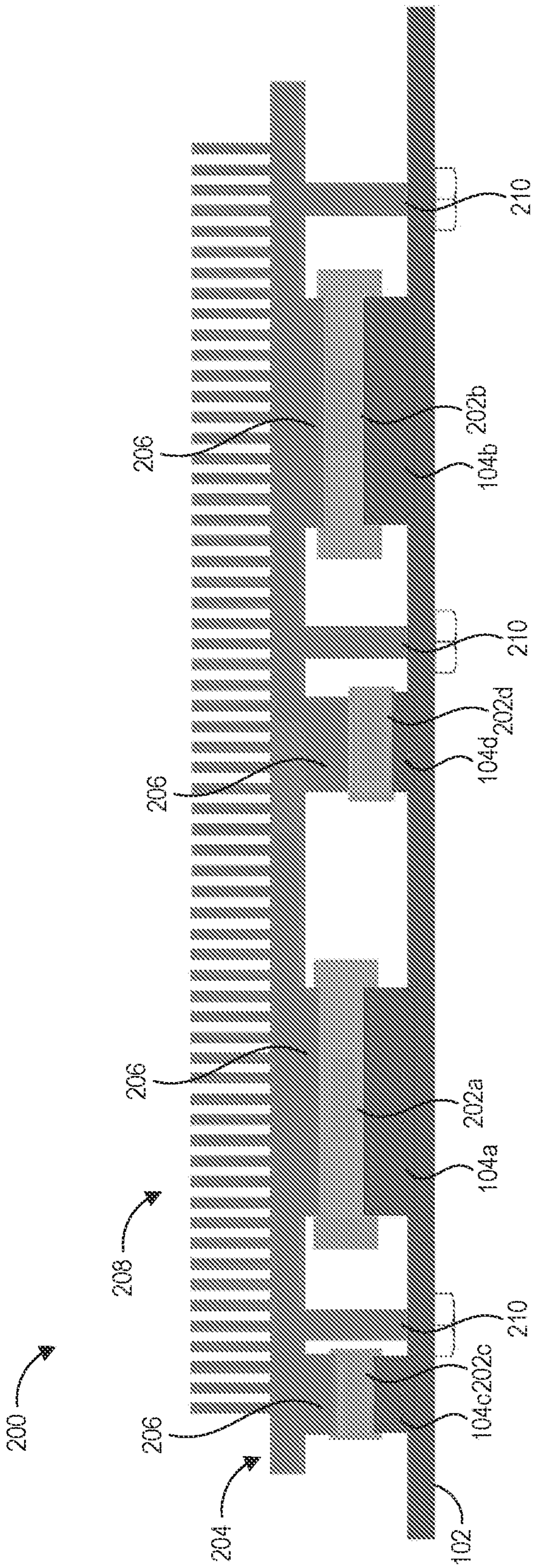
FIG. 2 is a cross-sectional view of a processing system having a fixed gap heat sink in accordance with aspects of this disclosure.

One technique that can be used to cool the electronic components 104*a*-104*d* of FIG. 1 is a fixed gap heat sink. FIG. 2 is a cross-sectional view of a processing system 200 having a fixed gap heat sink 204 in accordance with aspects of this disclosure. As shown in FIG. 2, the processing system 200 includes a PCB 102, a plurality of electronic components 104*a*-104*d*, a plurality of thermal interface material (TIM) layers 202*a-d*, and a heat sink 204. As described above, the individual electronic components 104*a*-104*d* may have different heights, and, thus, extend different distances from the PCB 102 in the Z-direction. In order to provide cooling to the electronic components 104*a*-104*d*, the heat sink 204 includes a plurality of pedestals 206, a plurality of fins 208, and a plurality of standoffs 210. Each of the pedestals 206 may be configured to contact a corresponding one of the electronic components 104*a*-104*d*, for example, via a corresponding one of the TIM layers 202*a-d*. Thus, the heat sink 204 can be configured to dissipate heat from each of the electronic components 104*a*-104*d* via the thermal connections formed via the pedestals 206 and TIM layers 202*a-d* to cool the electronic components 104*a*-104*d*.

In order to dissipate heat generated by the electronic components 104*a*-104*d*, each of the pedestals 206 may extend a distance from the body of the heat sink 204 that corresponds to the height of the corresponding electronic component 104*a*-104*d*. Although the processing system 200 of FIG. 2 enables the heat sink 204 to cool the electronic components 104*a*-104*d* having different heights, using fixed gaps between the heat sink 204 and respective electronic components 104*a*-104*d* may not sufficiently account for variations in the heights of the electronic components 104*a*-104*d* occurring due to variations in the tolerances of the electronic components 104*a*-104*d* due to manufacturing. This technical problem may be compounded for cooling solutions designed to cool a number of electronic components 104*a*-104*d*, which may have different heights and/or different tolerances.

One way in which variations in the gap between the pedestals 206 and the respective electronic components 104*a*-104*d* can be accounted for is to provide the TIM layers 202*a-d* with a sufficient thickness to account for the largest possible gap between the pedestals 206 and the electronic components 104*a*-104*d* due to tolerances. Thus, the TIM layers 202*a-d* can absorb the tolerance in gap between the electronic components 104*a*-104*d* and pedestals 206.

However, there may be a number of drawbacks to using TIM layers 202*a-d* which have sufficient thickness to absorb the tolerance in the gap. For example, TIM layers 202*a-d* may have a relatively high thermal impedance when compared to other materials in the thermal path between the electronic components 104*a*-104*d* and the pedestals 206. For example, certain materials which are can be used in the thermal path include: aluminum having a thermal conductivity of about 150 W/mK, copper having a thermal conductivity of about 350 W/mK, and silicon having a thermal conductivity of about 150 W/mK. In contrast, a typical TIM has a thermal conductivity of about 10 W/mK or less. Thus, a TIM layer can have a thermal performance of at least about 15 times less than an aluminum layer of the same thickness in certain applications. Due to its relatively high thermal conductivity, providing one or more TIM layers 202*a-d* with sufficient thickness(es) to absorb tolerances in the gap between the electronic components 104*a*-104*d* and the pedestals 206 may introduce additional thermal resistance in the thermal path, thereby reducing the efficiency of the cooling solution.

Another drawback to including fixed gaps between electronic components and corresponding pedestals relates to the case in which the tolerances add up to provide a gap which is less than a nominal gap between the electronic components 104*a*-104*d* and the pedestals 206. As used herein, the term "nominal gap" generally refers to a gap in which the heights of the electronic components 104*a*-104*d*, the pedestals 206, and any other components in the stack do not vary from their designed heights. When the gap is less than the nominal gap, the TIM layers 202*a-d* may be compressed when the heat sink 204 is attached to the PCB 102, leading to additional pressure being applied to the electronic components 104*a*-104*d*. This additional pressure may damage the electronic components 104*a*-104*d* over time.

Figure 3:
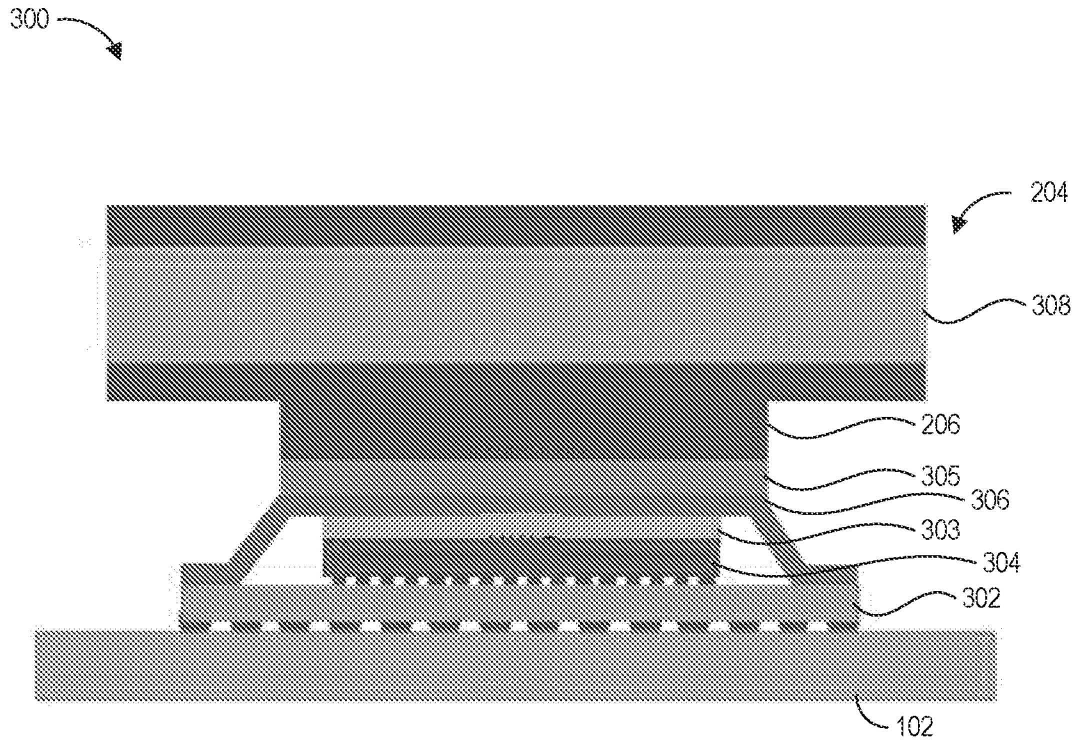
FIG. 3 is a cross-sectional view of a thermal stack for cooling an electronic component in accordance with aspects of this disclosure.

FIG. 3 is a cross-sectional view of a thermal stack 300 for cooling an electronic component in accordance with aspects of this disclosure. As shown in FIG. 3, the thermal stack 300 includes a PCB 102, a substrate 302, a die 304, a first TIM layer 303, a lid 306, a second TIM layer 305, and a heat sink 204 including a pedestal 206 and one or more convection components 308. The second TIM layer 305 can correspond to the TIM layers 202*a-d* in FIG. 2. The one or more convection components 308 can include a coolant (e.g., a liquid coolant or gas coolant) and cooling fins. In some implementations, the substrate 302, the die 304, the first TIM layer 303, and the lid 306 together form an electronic component (e.g., one of the electronic components 104*a*-104*d* of FIGS. 1 and/or 2). Each of the materials in the thermal stack 300 may contribute to the total temperature rise from the coolant to the die 304.

In the thermal stack 300, the second TIM layer 305 can have the largest contribution of the total temperature rise of the thermal stack 300. For example, analysis of the thermal stack 300 indicates that the second TIM layer 305 can contribute about 30% of total temperature rise of the thermal stack 300. Thus, the second TIM layer 305 may be a bottleneck in the thermal stack 300 with respect to cooling efficiency. The cooling efficiency of the thermal stack 300 can be improved by reducing the temperature rise contribution of the second TIM layer 305. One way in which the thermal impedance of the second TIM layer 305 can be reduced is to reduce the thickness of the second TIM layer 305. Embodiments of this disclosure which enable a reduced thickness second TIM layer 305 while addressing some or all of the above-discussed technical problems related to tolerances in the thermal stack 300 are provided herein. This may decrease the temperature rise between the die 304 and the coolant, enabling processors to run at higher coolant temperatures.

Figure 4:
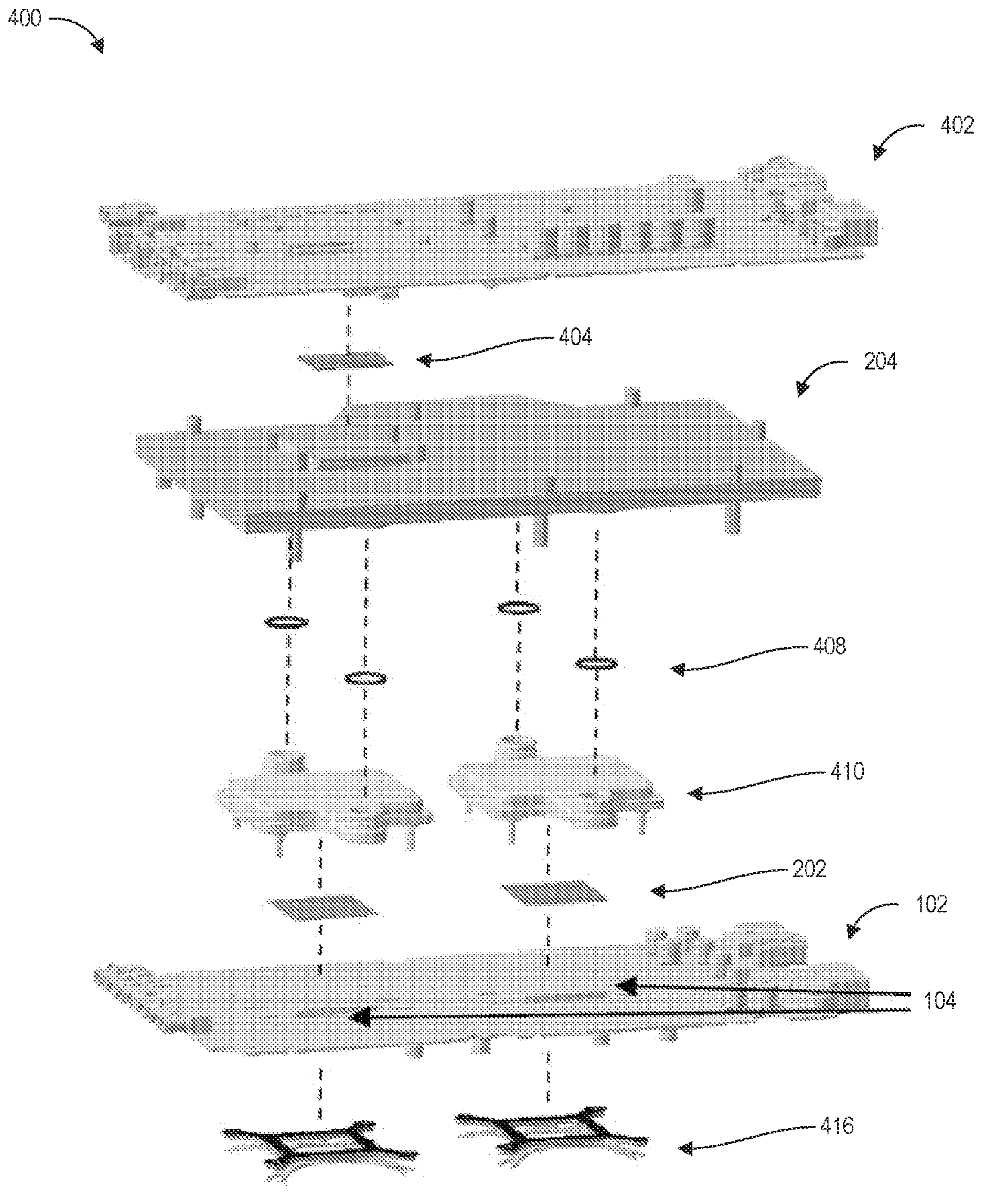
FIG. 4 is an exploded view of a processing system having sliding pedestals in accordance with aspects of this disclosure.

FIG. 4 is an exploded view of a processing system 400 with sliding pedestals 410 in accordance with aspects of this disclosure. With reference to FIG. 4, the processing system 400 includes a media control unit (MCU) PCB 402, a first TIM layer 404, a cold plate 204, a plurality of O-rings 408, a pair of sliding pedestals 410, second and third TIM layers 202, a pair of high-power processors 104, a processor PCB 102, and a pair of spring loaded back plates 416.

The cold plate 204 may be configured to cool both at least a portion of the MCU PCB 402 and the high-power processors 104. Although embodiments of this disclosure are described as including high-power processors 104, this disclosure is not limited thereto. In particular, in some other embodiments, the sliding pedestals 410 can be used to cool electronic components other than high-power processors 104. For example, sliding pedestals in accordance with any suitable principles and advantages disclosed herein can be implemented in cooling systems arranged to cool any suitable integrated circuit die, processor chip, or the like. The sliding pedestals 410 are dimensioned to cover respective processors 104 in FIG. 4. The processors 104 are examples of integrated circuit dies.

Each of the sliding pedestals 410 may be sealed to the cold plate 204 via O-rings 408, while still allowing the sliding pedestals 410 to move freely in the Z-direction with respect to the cold plate 204. In certain embodiments, the sliding pedestals 410 may be spaced a variable distance in the Z-direction from the PCB 102 so as to compensate for any variations in a tolerance in a height of the high-power processors 104.

While the sliding pedestals 410 are not fixed in the Z-direction, the sliding pedestals 410 may not move significantly in the Z-direction after installation. However, under certain circumstances, the sliding pedestals 410 may move in the Z-direction after installation. For example, one or more components in the thermal stack may expand and/or contract under changes in temperature. Accordingly, the sliding pedestals 410 may move in the Z-direction based on such expansions/contractions. The sliding pedestals 410 can dynamically adjust Z-position using use of the processing system 400. Further, although O-rings 408 may be used in certain embodiments, in some other embodiments, the sliding pedestals 410 may be sealed to the cold plate 204 using other connection components, such as, flexible hose connections.

As described at least in connection with FIG. 6, the cold plate 204 can function at least partially to route a coolant through the sliding pedestals 410 to draw heat from the thermal stack including the sliding pedestals 410, second and third TIM layers 202, and high-power processors 104. For other electrical components which do not have specifications for the same level of cooling as the high-power processors 104, the cold plate 204 may include pedestals with fixed gaps (e.g., as shown in FIG. 2) to cool these other electrical components.

Although the FIG. 4 embodiment is illustrated with a pair of sliding pedestals 410 configured to cool a pair of high-power processors 104, this disclosure is not limited thereto. For example, a single sliding pedestal 410 and high-power processor 104 pair or three or more sliding pedestal 410 and high-power processor 104 pairs may be provided in some embodiments. In certain applications, an additional sliding pedestal 410 may be provided between the cold plate and the first TIM layer 404 to cool a processor (not illustrated in FIG. 4) on the MCU PCB 402 in some other embodiments, thereby providing sliding pedestals 410 on opposing sides of the cold plate 204.

Aspects of the sliding pedestal architectures described herein can be used to cool electronic components with varying levels of power density in a confined volume, while reducing the thermal interface impedance of heat sources (e.g., electronic components including high-power processors 104). The main cold plate 204 and sliding pedestals 410 can be formed of thermally conductive materials for the cooling function, and compliant seal (e.g., the O-rings 408 or a gasket) can be used to provide a seal between sliding pedestals 410 and the cold plate 204. The cold plate 204 can employ various internal cooling fin geometries to regulate the cooling efficiency.

In some embodiments, the cold plate 204 can serve at least three different functions, including: distributing flow substantially evenly to the sliding pedestals 410, cooling electronic components (e.g., processor chips) on the MCU PCB 402 with a dense fin array (which can provide high efficiency cooling), and cooling lower power electronic components on the processor PCB 102 and MCU PCB 402 through a main channel defined within the cold plate 204.

The sliding pedestals 410 may be unconstrained vertically enabling a relatively low impedance thermal interface between coolant and the high-power processors 104 compared to fixed gap implementations. The sliding pedestals 410 are configured to move vertically after assembly. A fluid seal between the sliding pedestals 410 and the cold plate 204 can be maintained dynamically through the compression of the radial O-rings 408 on the inlets and outlets of the sliding pedestals 410. Each of the sliding pedestals 410 can include a dense fin array to improve the efficiency of cooling the high-power processors 104.

The spring loaded back plates 416 can be configured to pull the sliding pedestals 410 down onto the processor PCB 102 to apply a substantially uniform pressure on the high-power processors 104, and thereby reduce the thermal interface impedance. By allowing the sliding pedestals 410 to move in the Z-direction, the pressure applied between the sliding pedestals 410 and the high-power processors 104 can be decoupled from the electrical chip tolerance variations, thereby enabling the pressure to be set by the spring loaded back plates 416.

In addition, the interface between the sliding pedestals 410 and the cold plate 204 can include a mechanical retainer configured to retain the sliding pedestals 410, such that coolant pressure inside the manifold of the cold plate 204 cannot push the sliding pedestals 410 so far away from the cold plate 204 that the sliding pedestals 410 disconnect from the cold plate 204.

Figure 5A:
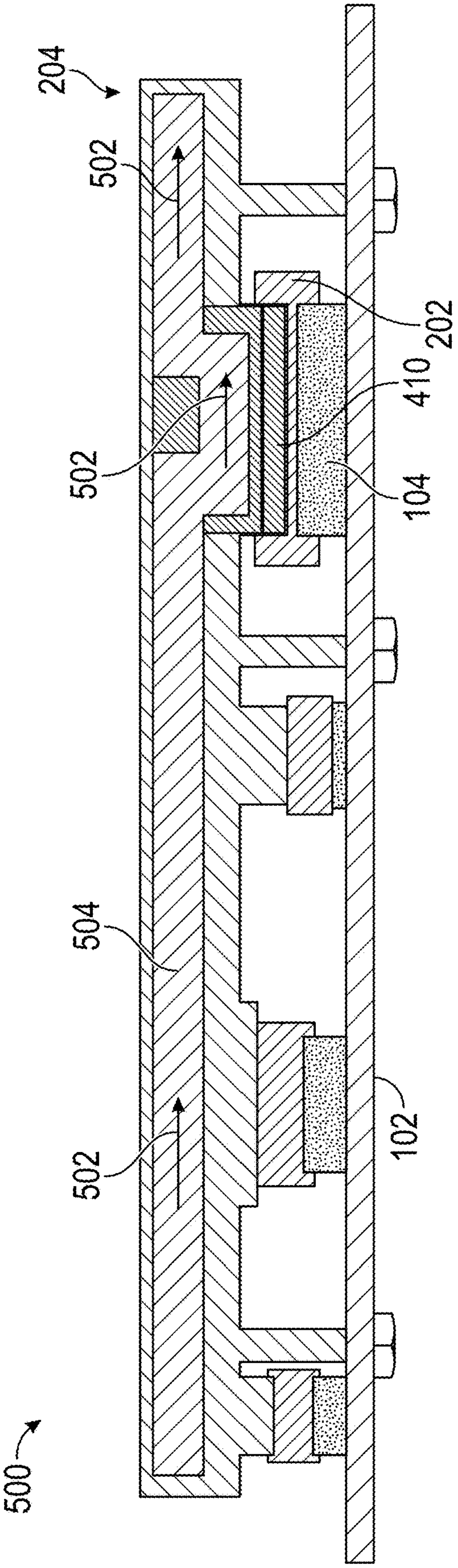
FIGS. 5A-5C illustrate cross-sectional views of a processing system showing the vertical movement of a sliding pedestal in accordance with aspects of this disclosure.
Figure 5B:
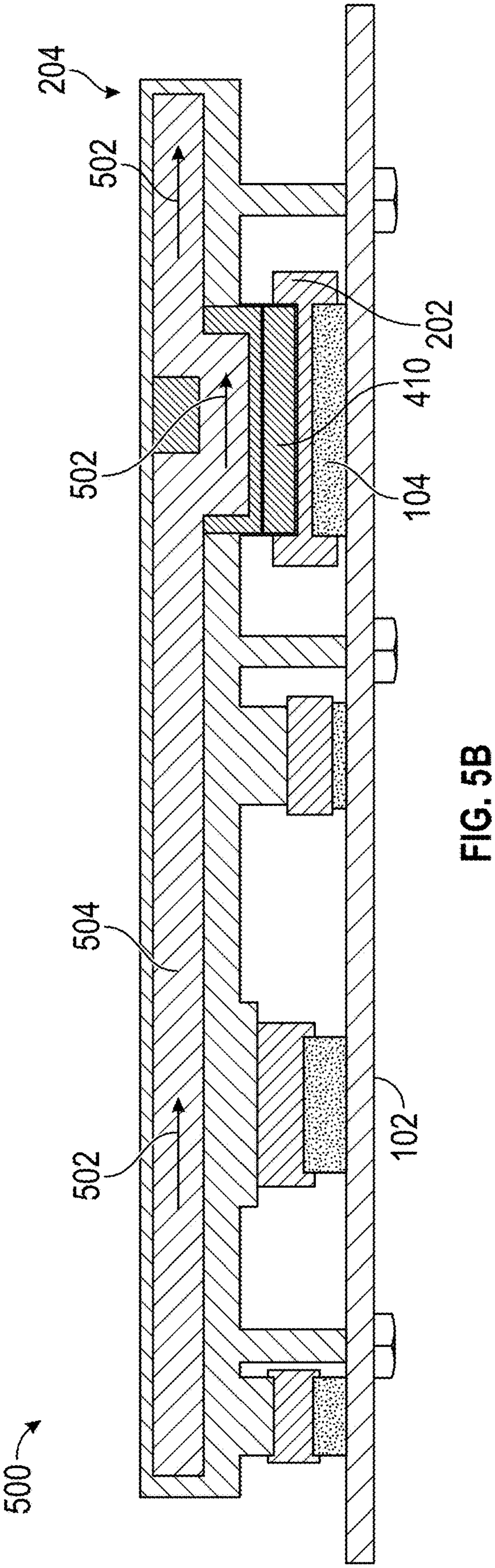
Figure 5C:
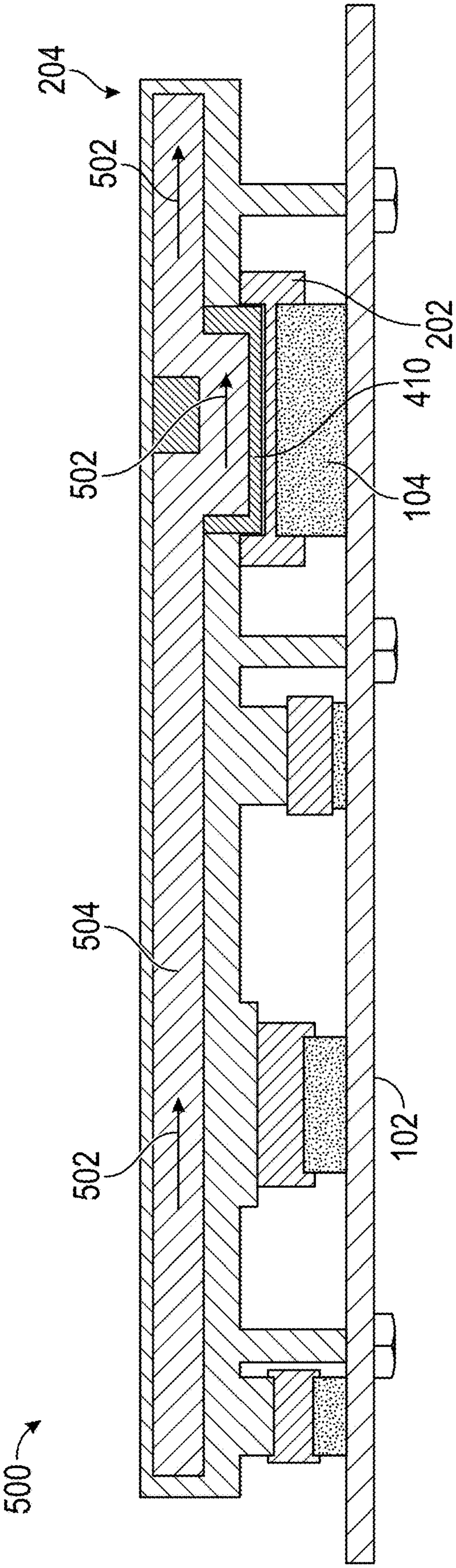

FIGS. 5A-5C illustrate various cross-sectional views of the processing system 500 showing the vertical movement of a sliding pedestal 410 in accordance with aspects of this disclosure. The processing system 500 of the embodiment illustrated FIGS. 5A-5C may include a single sliding pedestal 410 positioned between a high-power processor 104 and a cold plate 204. Although FIGS. 5A-5C illustrate an embodiment in which a single sliding pedestal 410 is used, this disclosure is not limited thereto and a plurality of sliding pedestals 410 can be installed to cool other electronic components located on the PCB 102.

A TIM layer 202 is positioned between the high-power processor 104 and the sliding pedestal 410. In contrast to fixed gap implementations, the TIM layer 202 may be formed to have a thickness that is significantly thinner than a TIM layer 202 used in a fixed gap implementation. Because the sliding pedestal 410 is not constrained in the Z-direction, the sliding pedestal 410 can absorb any variations in the height of the high-power processor 104 and any other components in the thermal stack (e.g., see the thermal stack 300 of FIG. 3), the TIM layer 202 may not need to absorb any of the variations in height of the thermal stack, and thus, can be thinner.

FIG. 5A illustrates an embodiment in which the tolerances in the thermal stack may add up to be close to a nominal value (e.g., the height of the thermal stack when the components in the stack do not vary from their designed heights), FIG. 5B illustrates an embodiment in which the tolerances in the thermal stack may add up to be significantly less than the nominal value, and FIG. 5C illustrates an embodiment in which the tolerances in the thermal stack may add up to be significantly greater than the nominal value. The embodiments of FIGS. 5A to 5C show how the sliding pedestal 410 can move in the Z-direction to compensate for variations in Z-height of one or more components (e.g., a processor 104) in a thermal stack. These figures show that the sliding pedestal 410 can absorb Z-height variations. The sliding pedestal 410 can be referred to as a tolerance absorbing pedestal.

FIGS. 5A to 5C also illustrate the direction 502 of flow of a coolant 504 through the cold plate 204. The coolant 504 can flow through the sliding pedestal 410 in order to help cool the high-power processor 104. The coolant 504 can also help in cooling other components that are connected to cold plate 204 without the use of a sliding pedestal 410.

Figure 6A:
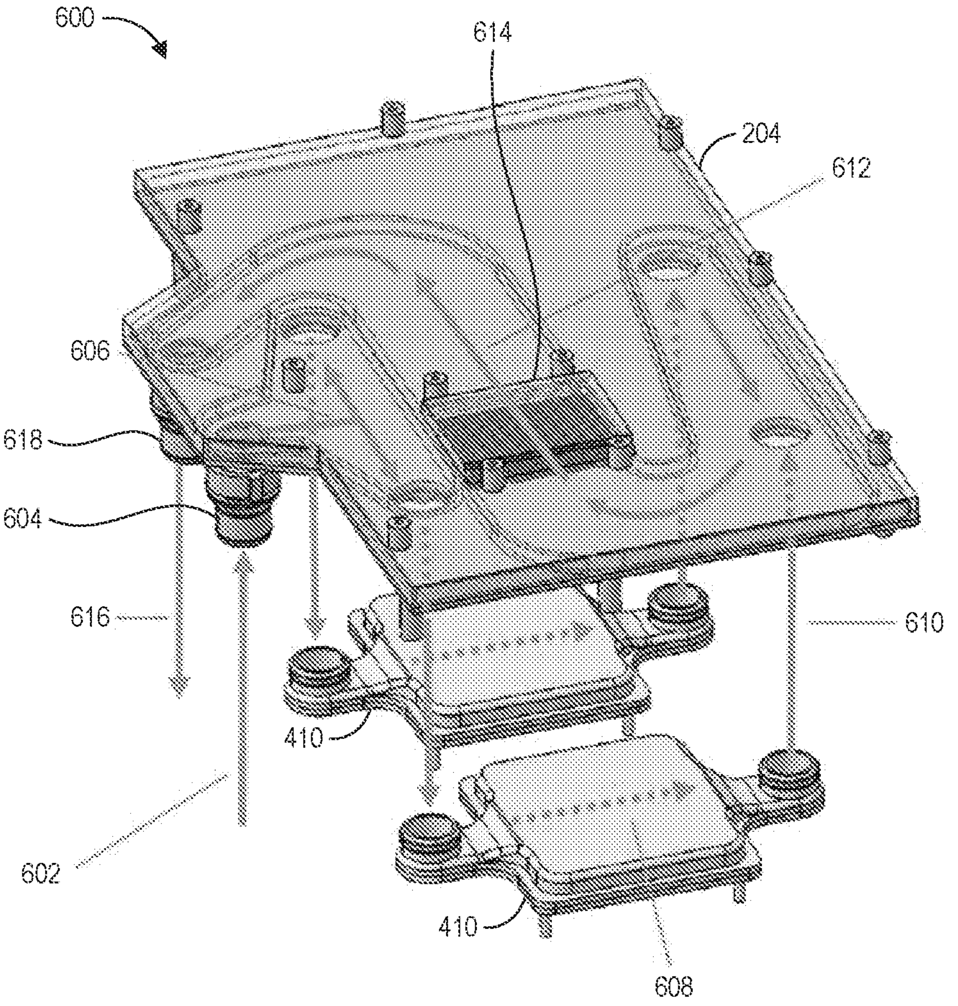
FIGS. 6A and 6B illustrate an example manifold design for a cold plate and sliding pedestals in accordance with aspects of this disclosure.
Figure 6B:
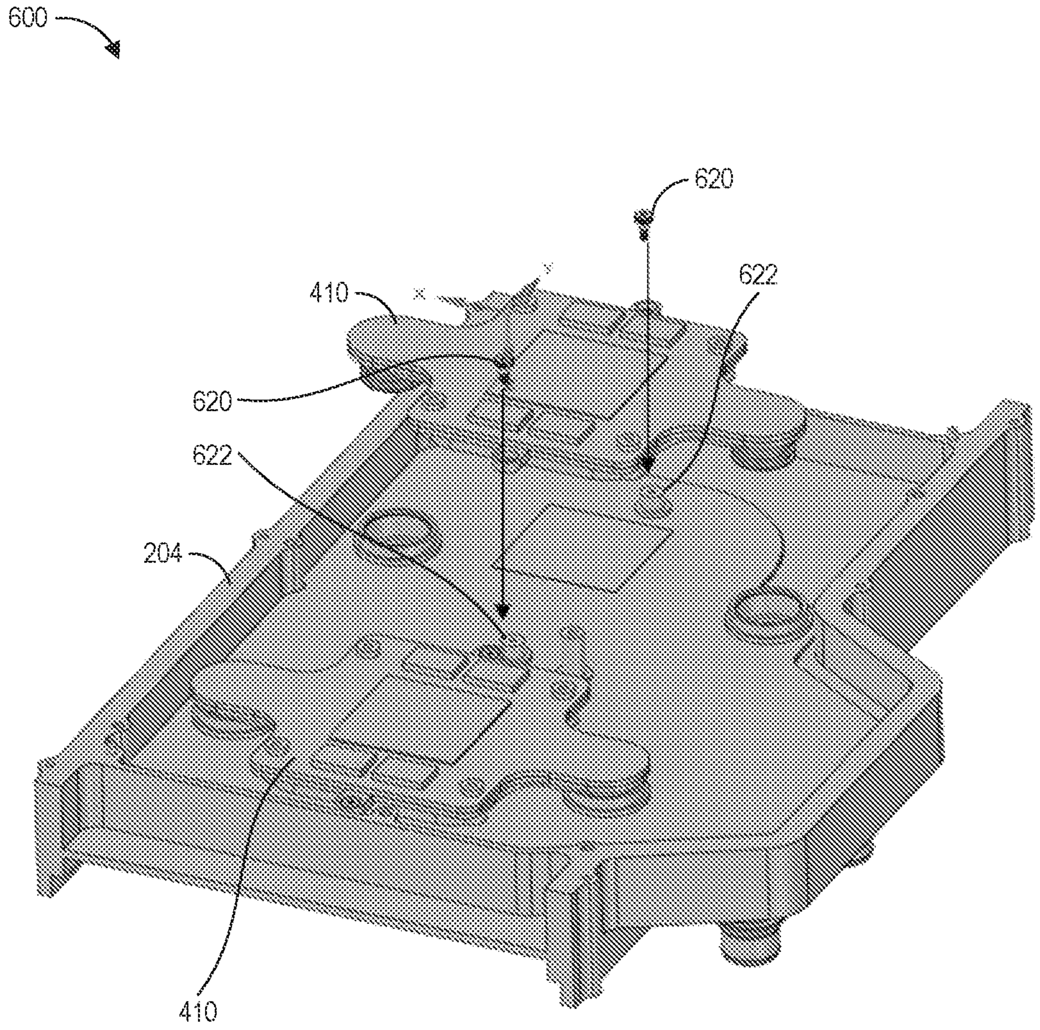

FIGS. 6A and 6B illustrates an example manifold 600 for the cold plate 204 in accordance with aspects of this disclosure. Coolant flow operations are also labeled in FIG. 6A. In particular, FIG. 6A illustrates the manifold 600 from above, while FIG. 6B illustrates the manifold 600 from below. With reference to FIG. 6A, a coolant flows into an inlet 604 of the cold plate 204 at operation 602. The coolant can be a liquid coolant or a gas coolant. With the coolant, the cold plate 204 can provide active cooling. The coolant flow is split into two parallel paths at operation 606 such that the coolant flows into each of the sliding pedestals 410. At operation 608 the coolant flows through the sliding modules 410, thereby cooling corresponding electronic components, and returns back to the cold plate 204 at operation 610. At operation 612, the coolant then flows through a fin array 614 to cool an electronic component located above the cold plate 204. Finally, at operation 616 the coolant flows out of the cold plate 204 via an outlet 618.

With reference to FIG. 6B, each of the sliding pedestals 410 can be attached to the cold plate 204 via a pair of screws 620 and threading 622 on the cold plate 204. In certain embodiments, the screws 620 can extend a set length from the cold plate 204, limiting the travel of the sliding pedestals 410 along the screws 620 away from the cold plate 204 by interference with the heads of the screws 620. In the illustrated embodiments, each of the sliding pedestals 410 is shown as attached to the cold plate 622 via a pair of screws, however, in other embodiments, a single screw 620 or three or more screws 620 may be used.

In some embodiments such as the implementation of FIGS. 6A and 6B, the cold plate 204 manifold 600 can serve a number of different functions. One function includes distributing flow substantially evenly to the sliding pedestals 410 in order to cool high-power processors (e.g., the high-power processors 104 in FIGS. 4 and 5A-5C). Another function includes cooling processor chip(s) on the MCU PCB (e.g., see the MCU PCB 402 of FIG. 4) using the fin array 614 (which can provide high efficiency cooling). In some embodiments, the MCU processor chip(s) may not have specifications for the same level of efficient cooling as the high-power processors 104, and thus, the fin array 614 may provide sufficient cooling for the MCU processor chip(s) without the use of sliding pedestals 410 to reduce the thickness of the first TIM layer (e.g., see the first TIM layer 404 of FIG. 4). However, in some other embodiments, at least one sliding pedestal may be provided above the cold plate 204 in order to allow the use of a comparatively thin first TIM layer to provide more efficient cooling of the MCU processor chip(s).

Yet another function includes cooling low power electronic components on the processor PCB 102 and MCU PCB 402 through the main channel of the manifold 600 defined within the cold plate 204. For example, the cold plate 204 may include one or more fixed gap pedestals 206 configured to cool the low power electronic components on the processor PCB 102 and the MCU PCB 402.

Figure 7:
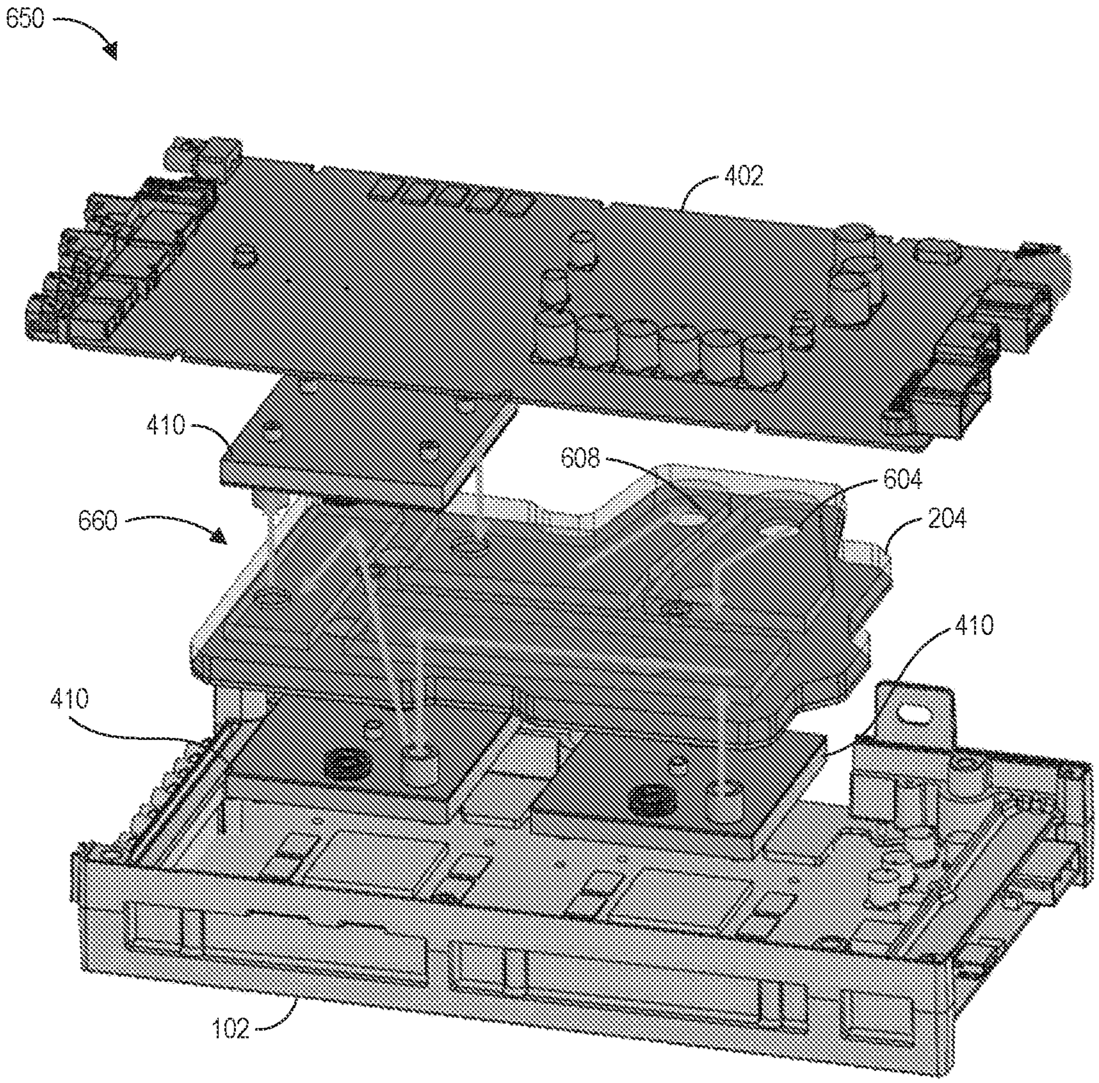
FIG. 7 is an exploded view of a processing system with sliding pedestals arranged on both sides of the cold plate in accordance with aspects of this disclosure.

FIG. 7 is an exploded view of a processing system 650 with sliding pedestals 410 arranged on both sides of the cold plate 204 in accordance with aspects of this disclosure. As shown in FIG. 7, the cold plate 204 includes an example manifold 660 configured to route coolant through each of the sliding pedestals 410. The coolant can flow into the manifold 660 from an inlet 604, through the two sliding pedestals 410 arranged below the cold plate 204 and then through the sliding pedestal 410 arranged above the manifold 660 before exiting the manifold 660 at the outlet 618. The sliding pedestal 410 arranged above the cold plate 204 can be configured to cool a processor attached to the bottom of the MCU PCB 402 while the sliding pedestals 410 arranged below the cold plate 204 can be configured to cool corresponding processors attached to the top of the ADAS PCB 102.

Figure 8:
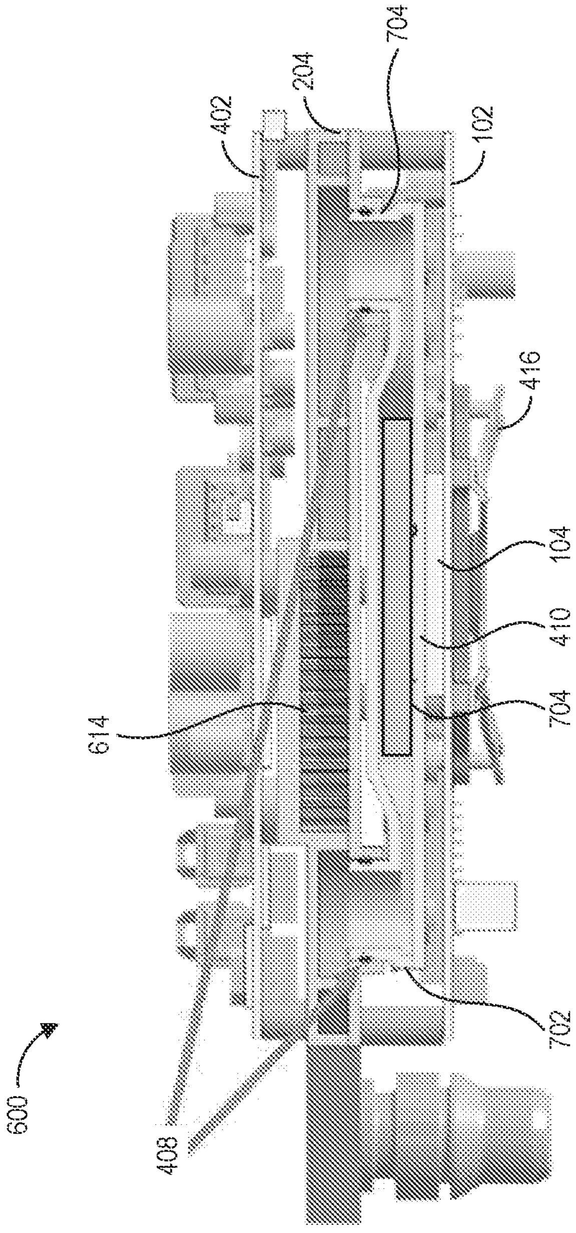
FIG. 8 is a cross-sectional view of the example manifold for the cold plate of FIGS. 6A and 6B and a sliding pedestal assembled with two printed circuit boards (PCBs) in accordance with aspects of this disclosure.

FIG. 8 is a cross-sectional view of the example manifold 600 for the cold plate 204 of FIGS. 6A and 6B and a sliding pedestal 410 assembled with the processor PCB 102 and the MCU PCB 402. In particular, FIG. 8 shows a spring loaded back plate 416 configured to pull the sliding pedestal 410 towards the processor PCB 102. The spring loaded back plate 416 may be configured to apply a substantially uniform pressure on the high-power processor 104, which can result in a reduction in thermal interface impedance.

Also shown in FIG. 8 is the cold plate 204 positioned between the processor PCB 102 and MCU PCB 402. O-rings 408 are provided to maintain a dynamic fluid seal between the sliding pedestal 410 and the cold plate 204 through the radial compression of the O-rings 408 at and inlet 702 and outlet 704 of the sliding module 410. The sliding pedestal 410 further includes a dense fin array 704 configured to aid in highly efficient cooling of the high-power processor 104. As described above, the interface between the sliding pedestal 410 and the cold plate 204 can include a mechanical retainer configured to retain the sliding pedestals 410, such that coolant pressure inside the manifold of the cold plate 204 cannot push the sliding pedestals 410 so far away from the cold plate 204 that the sliding pedestals 410 disconnect from the cold plate 204. The mechanical retainer can include screws.

With reference to FIGS. 6A, 6B, and 8, the fluid enters the sliding pedestal 410 at the inlet 702 and flows through the fin array 704 such that the fluid travels substantially parallel to the fins of the array 704 before flowing out of the sliding pedestal at the outlet 704. The majority of the heat transfer from the high-power processor into the coolant may occur as the fluid flows through the fin array in the sliding pedestal 704. Similar coolant flow can apply to other manifold and sliding pedestal geometries for cooling components in other systems.

Figure 9:
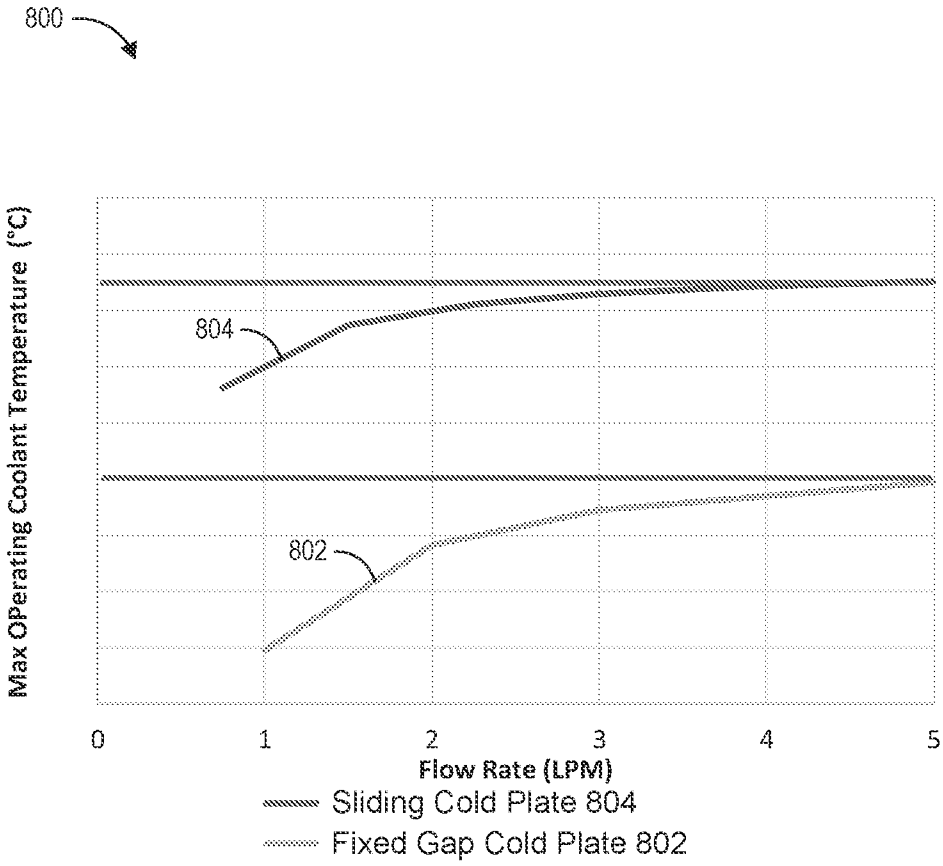
FIG. 9 is a graph illustrating the maximum coolant operating temperature of a fixed gap cold plate design and a sliding pedestal cold plate design in accordance with aspects of this disclosure.

FIG. 9 is a graph illustrating the maximum coolant operating temperature of a fixed gap cold plate design and a sliding pedestal cold plate design in accordance with aspects of this disclosure. As shown in FIG. 9, a curve 802 for the fixed gap cold plate design approaches a first maximum operating coolant temperature as the flow rate increases. In contrast, a curve 804 for the sliding pedestal and cold plate design approaches a second maximum operating coolant temperature as the flow rate increases, where the second maximum operating coolant temperature is higher than the first maximum operating temperature. In some embodiments, the first maximum operating coolant temperature may be about 6° C. less than the second maximum coolant temperature. Due to the ability of the sliding pedestal design to remove the impact of tolerances on the thermal interface between cooling solution and chip, the sliding pedestal design is able to operate at higher operating coolant temperatures, thereby enabling high-power processors to operate reliably at a relatively higher maximum coolant temperature.

While aspects of this disclosure have been described in a connection with the sliding pedestal 410 of FIGS. 4-8 which includes an inlet 702 and an outlet 704 that are each coupled to a cold plate 204, aspects of this disclosure are not limited thereto. In some embodiments, a sliding pedestal 908 may be coupled to a cold plate via a single piston/cylinder style connection. This type of connection may improve the stability of the sliding pedestal 908 by reducing or preventing any tilting/rocking of the sliding pedestal 908.

Figure 10B:
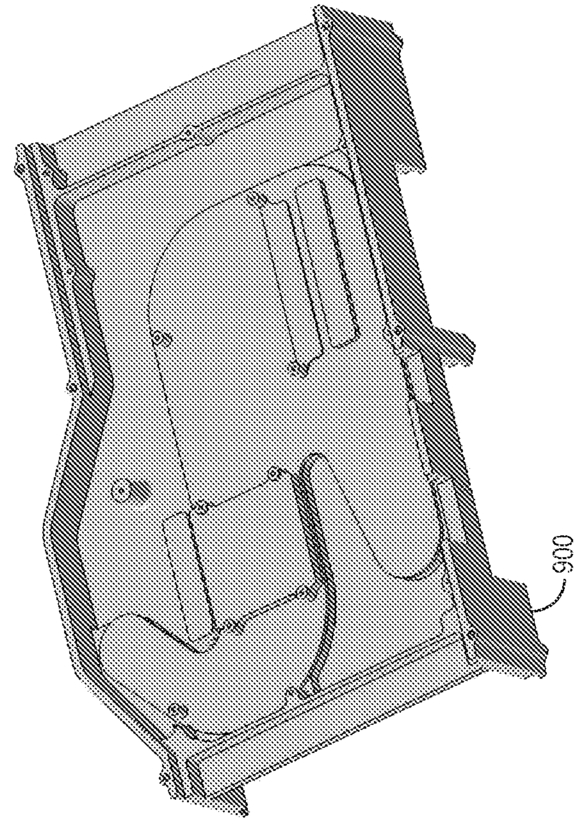
FIGS. 10A and 10B illustrate exterior views of an example manifold for a cold plate and sliding pedestals in accordance with aspects of this disclosure.
Figure 10A:
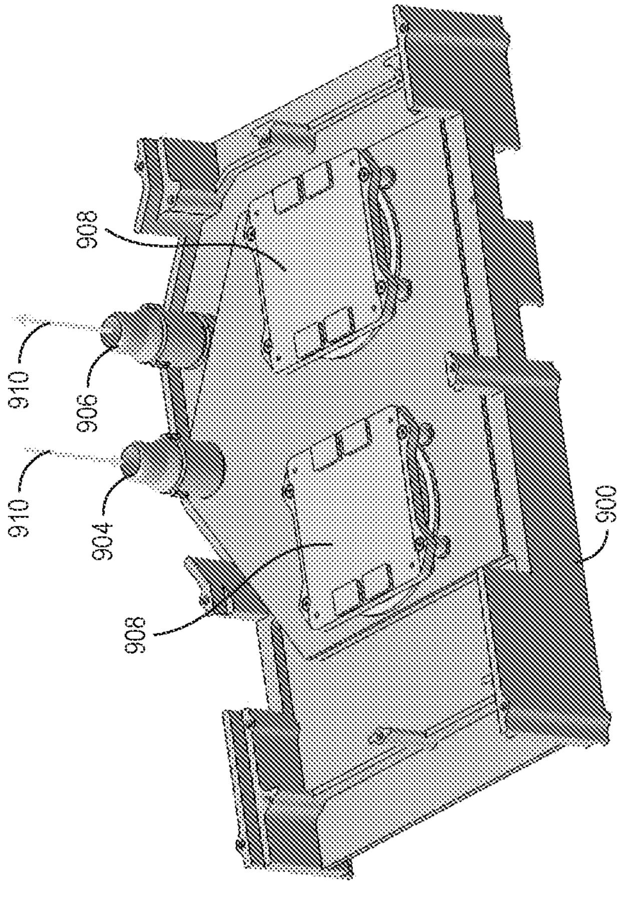

FIGS. 10A and 10B illustrate exterior views of an example manifold 900 for a cold plate and sliding pedestals 908 in accordance with aspects of this disclosure. In particular, FIG. 10A illustrates the manifold 900 from below and FIG. 10B illustrates the manifold 900 from above. The manifold 900 may also be referred to as a cold plate herein.

With reference to FIGS. 10A and 10B, the manifold 900 includes an inlet 904, and outlet 906 and is configured to connect to one or more sliding pedestals 908. The manifold 900 is configured to route coolant through each of the sliding pedestals 908. An example coolant flow 910 is illustrated where the coolant can flow into the manifold 900 from the inlet 904, through the two sliding pedestals 908, and exit the manifold 900 from the outlet 906.

Figure 11B:
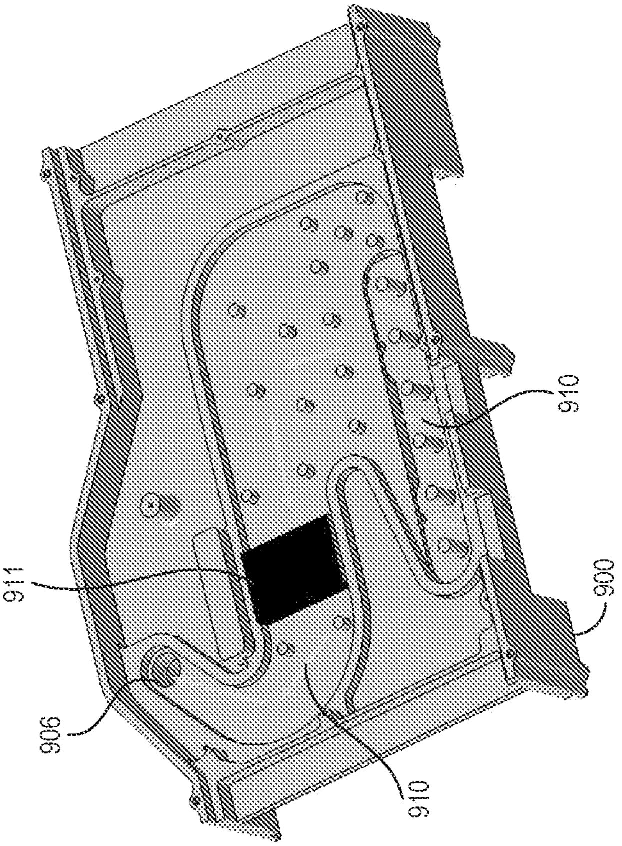
FIGS. 11A and 11B illustrate internal views of the example manifold in accordance with aspects of this disclosure.
Figure 11A:
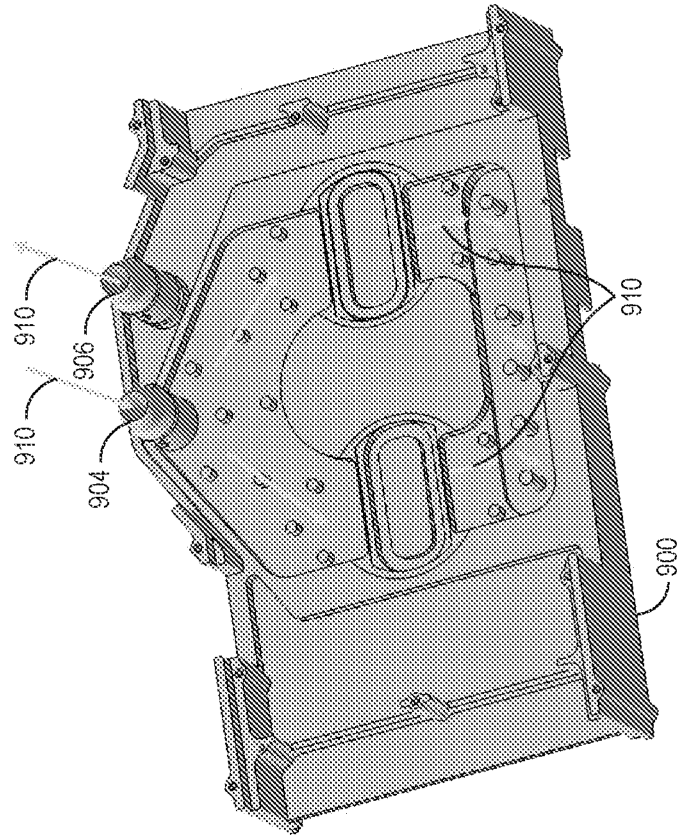

FIGS. 11A and 11B illustrate internal views of the example manifold 900 in accordance with aspects of this disclosure. With reference to FIG. 11A, a coolant flows into the inlet 902 of the manifold 900. The coolant can be a liquid coolant or a gas coolant. With the coolant, the manifold 900 can provide active cooling. The coolant flow 910 is split into two parallel paths during operation such that the coolant flows into each of the sliding pedestals 908.

After flowing through the sliding pedestals 908, the coolant flow 910 continues from the bottom side of the manifold 900 as shown in FIG. 11A to the top side of the manifold 900 illustrated in FIG. 11B. With reference to FIG. 11B, the coolant the flows through a fin array 911, thereby cooling electronic component(s) formed above the fin array 911. The coolant then flows to the outlet 906, exiting the manifold 900.

Figure 12A:
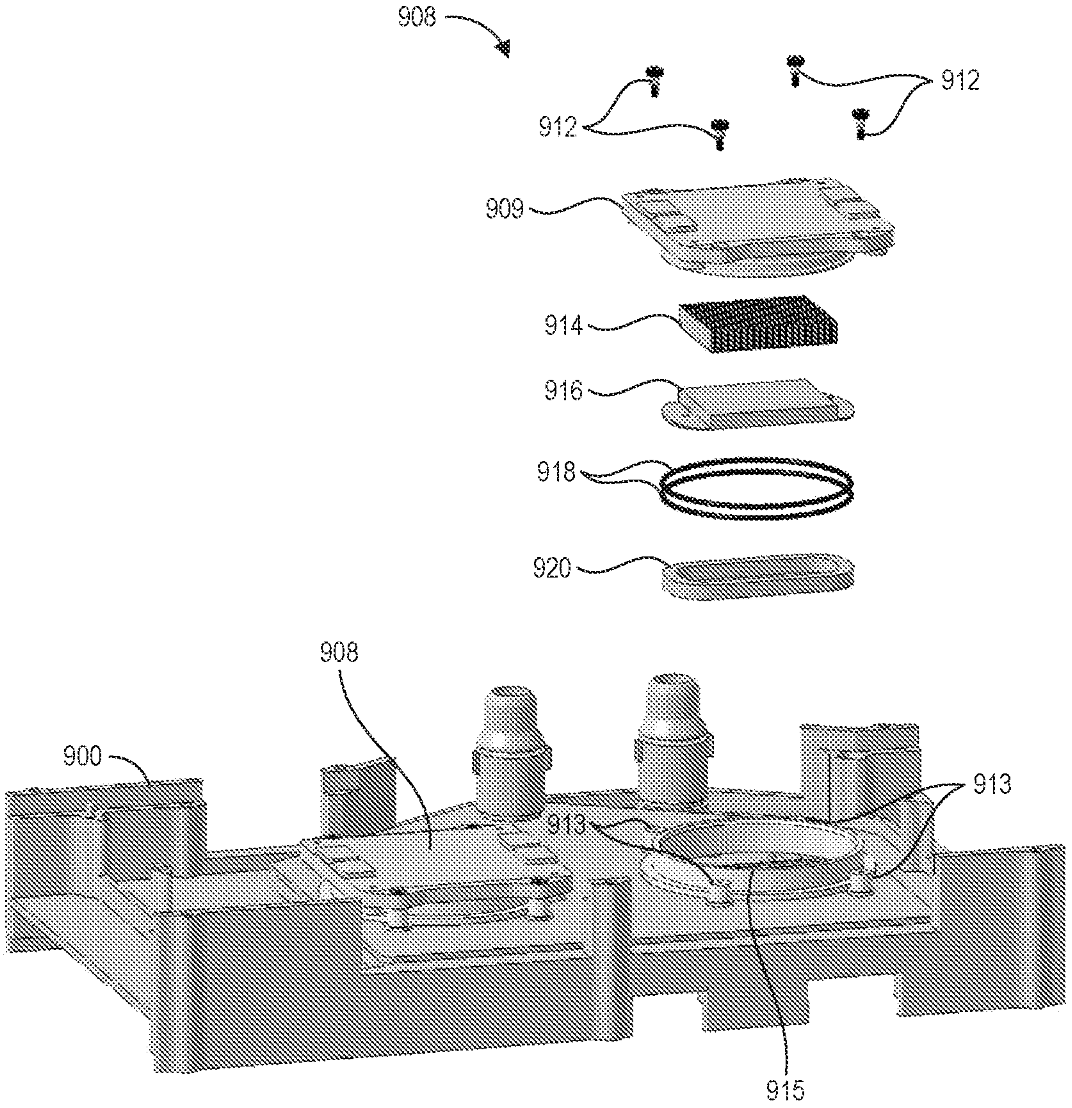
FIGS. 12A and 12B illustrate exploded views of an example sliding pedestal design which can be connected to a processing system in accordance with aspects of this disclosure.
Figure 12B:
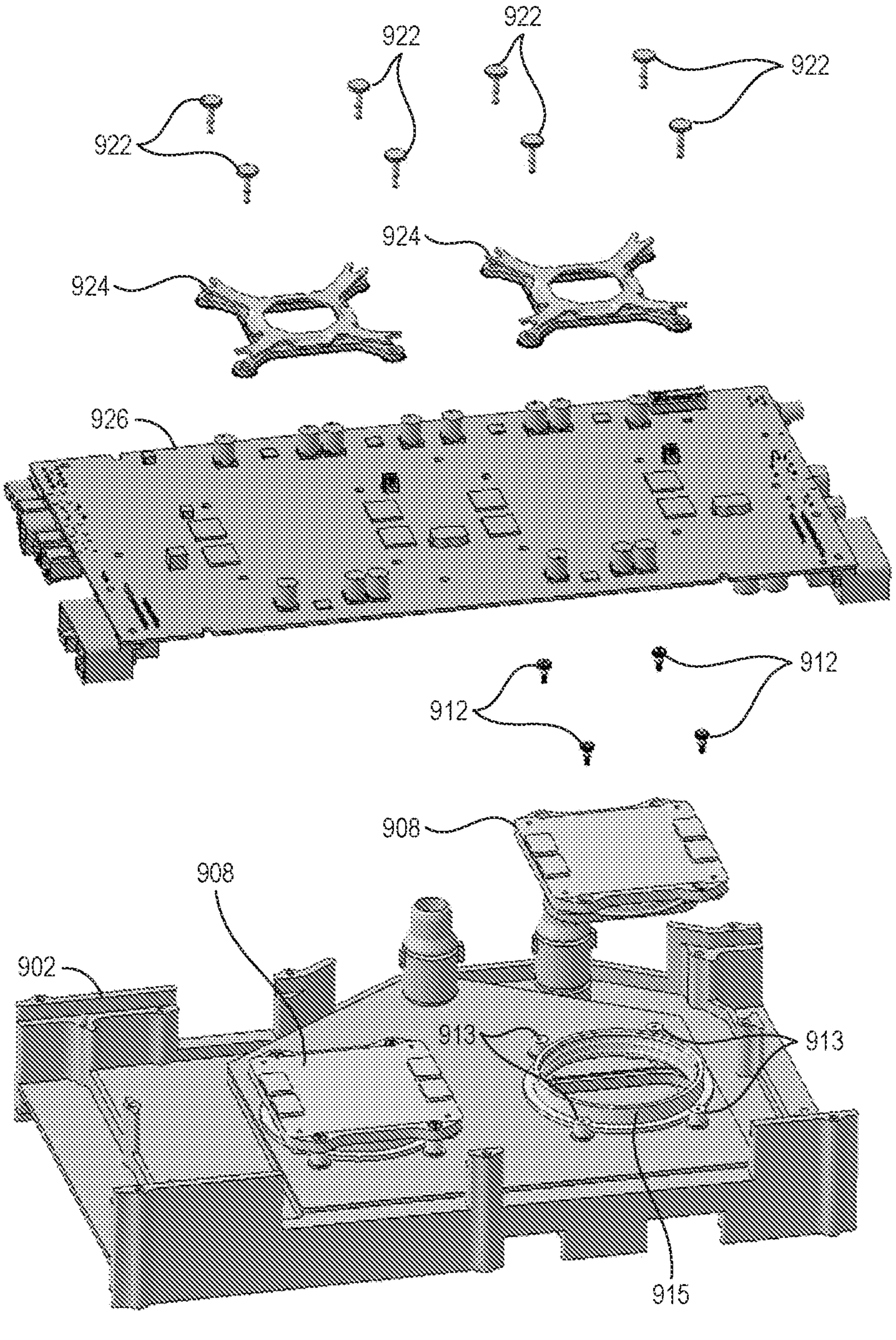

FIGS. 12A and 12B illustrate exploded views of an example sliding pedestal 908 that can be connected to a processing system in accordance with aspects of this disclosure. With reference to FIG. 12A, the sliding pedestal 908 includes a pedestal body 909, a plurality of fasteners 912 (e.g., screws), a fin array 914, a fin lid 916, a pair of O-rings 918, and a bypass seal 920. The sliding pedestal 908 is configured to be attached to attachment points 913 on the manifold 900 and at least a portion of the sliding pedestal 908 is configured to be received in a cylinder 915 formed in the manifold 900. In some implementations, the fasteners 912 may be embodied as travel-limiting shoulder screws that couple the pedestal body 909 to the manifold 900. In some embodiments, four fasteners 912 and corresponding attachment points 913 on the manifold 900 are used and positioned to reduce tilt/rocking of the sliding pedestal.

The fin array 914 is configured to provide heat transfer between the coolant and an electronic component 926 coupled to the sliding pedestal 908 for cooling the electronic component 926. The fin lid 916 is configured to secure the fin array 914 within the pedestal body 909. The O-rings 918 are configured to seal the pedestal body 909 to the manifold 900. By using a pair of O-rings 918, the seal may be more resistant to coolant leaks than using a single O-ring. The bypass seal 920 is configured to prevent the coolant from bypassing the sliding pedestal 908, routing the coolant to flow through fin array 914. In comparison to the sliding pedestal 410 of FIGS. 4-8, the sliding pedestal 908 has a larger inlet/outlet surface area which can reduce the pressure drop of the coolant passing through the sliding pedestal 908, but also may result in an increase in the force applied to the electronic component 926.

With reference to FIG. 12B, the electronic component 926 can be coupled to each of the sliding pedestals 908 via a pair of spring backplates 924 which are held in place using a plurality of screws 922. In some embodiments, the electronic component 926 may include one or more high power processors (similar to the high-power processors 104 shown in FIG. 4). Although a single electronic component 926 is illustrated in FIG. 12B, the sliding pedestals 908 may be configured to respectively cool a pair of electronic components 926 in some other embodiments. The spring loaded back plates 924 can be configured to pull the sliding pedestals 908 down onto the electronic component 926 to apply a substantially uniform pressure on the electronic component 926, and thereby reduce the thermal interface impedance. The spring loaded back plates 924 allow the sliding pedestals 908 to move in the Z-direction, such that the pressure applied between the sliding pedestals 908 and the electronic component 926 can be decoupled from the electrical chip tolerance variations, thereby enabling the pressure to be set by the spring loaded back plates 924.

Figure 13:
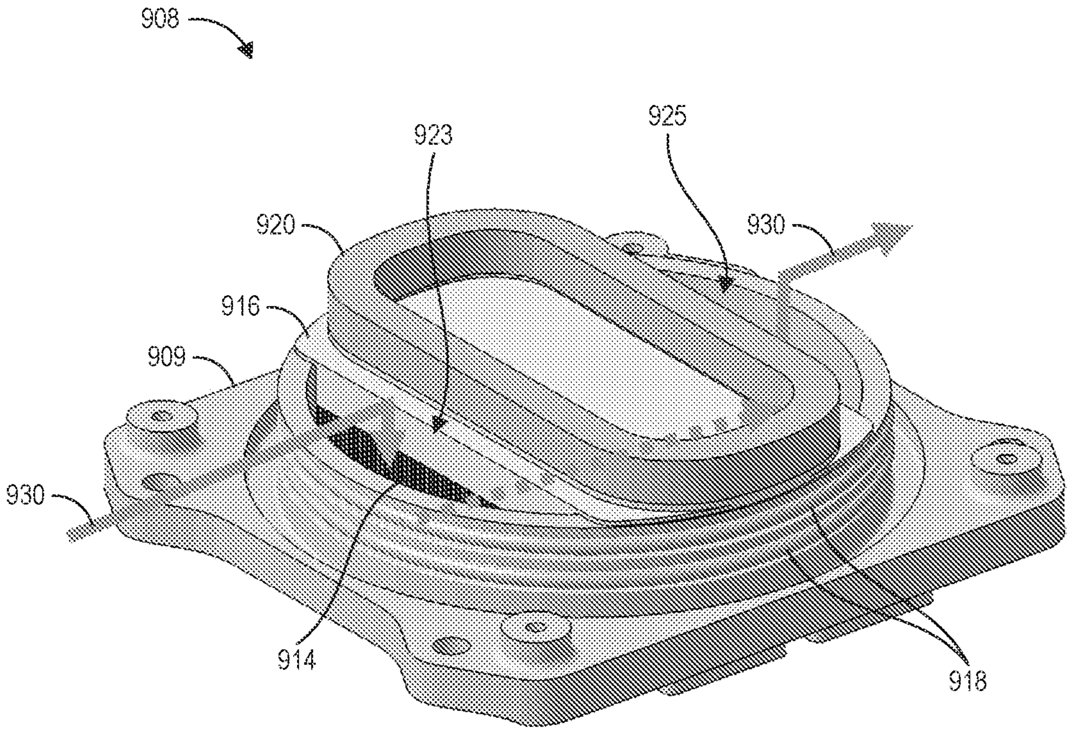
FIG. 13 illustrates the flow of a coolant through an example sliding pedestal in accordance with aspects of this disclosure.

FIG. 13 illustrates the flow 930 of a coolant through an example sliding pedestal 908 in accordance with aspects of this disclosure. As described herein, a portion the pedestal body 909 has a piston shape that is configured to be received in a cylinder of the manifold 900. Due to this configuration, the pedestal body 909 does not have an inlet and an outlet which are separately connected to the manifold as in the sliding pedestal 410 of FIGS. 4-8. Thus, the fin lid 916 together with the bypass seal 920 form an inlet 923 and an outlet 925 when installed in the pedestal body 909.

As shown in FIG. 13, the coolant flows 930 into the pedestal body 909 from the manifold 900 via the inlet 923 on one side of the bypass seal 920, flows 930 through the fin array 914, and then flows 930 back into the manifold 900 through the outlet on the opposite side of the bypass seal 920. The O-rings 928 further provide a seal between the pedestal body 909 and the manifold 900 such that the coolant does not leak from around the sides of the pedestal body 909 while the bypass seal 920 prevents coolant from bypass the sliding pedestal 908 entirely. By using a radial seal provided by the O-rings 928 around substantially the entire pedestal body 909, the sliding pedestal 908 can suppress or prevent titling/rocking about a central axis compared to the sliding pedestal 410 of FIGS. 4-8. For example, when the inlet 702 of the sliding pedestal 410 has more friction than the outlet 704, the sliding pedestal 410 may tilt, which can weaken the thermal interface with the attached electronic component 104. In addition, the coolant forces between the inlet 702 and the outlet 704 will be different due to the pressure drop therebetween, which may also result in tilt.

Figure 14A:
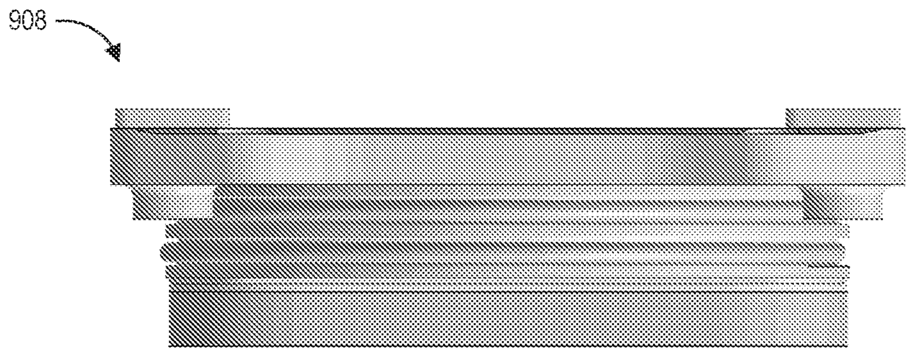
FIGS. 14A-14C illustrate number of view of the example sliding pedestal in accordance with aspects of this disclosure.
Figure 14B:
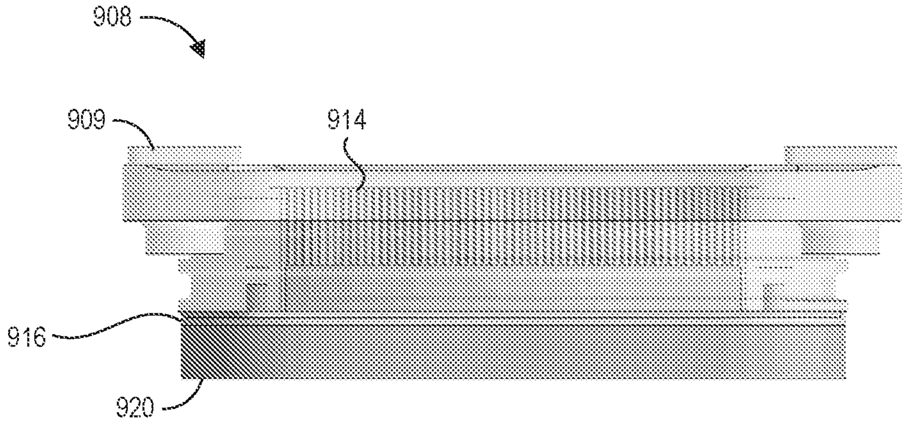
Figure 14C:
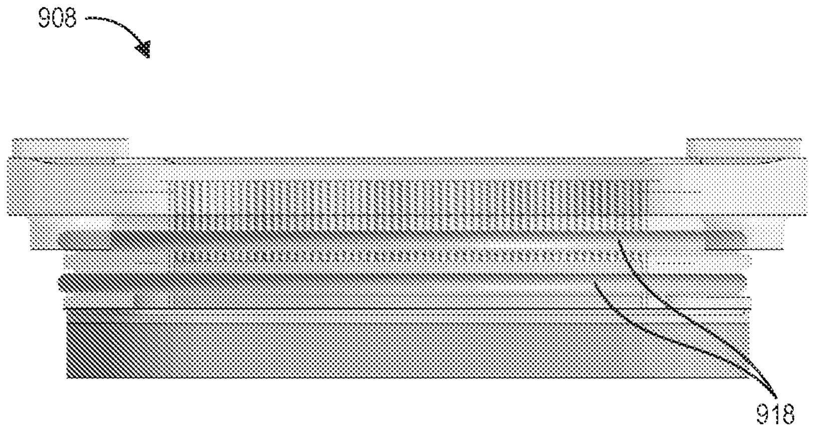

FIGS. 14A-14C illustrate views of the example sliding pedestal 908 in accordance with aspects of this disclosure. In particular, FIG. 14A is a side view of the sliding pedestal 908, FIG. 14B is a side view of the sliding pedestal 908 with transparency to show the location of the fin array 914 within the pedestal body 909, and FIG. 14C is a side view of the sliding pedestal 908 with transparency and the O-rings 918 shown in place when the sliding pedestal 908 is assembled.

With reference to FIGS. 12A-14C, each of the sliding pedestals 908 can be coupled to the manifold 900 via a piston/cylinder type of connection. In other words, the body of the sliding pedestal 908 has a shape similar to a piston while the manifold has a complementary shape similar to a cylinder into which the sliding pedestal 908 in inserted. By using this type of single concentric connection, the sliding pedestal 908 can be more stable and less likely to tilt/rock compared to the sliding pedestal 410 of FIGS. 4-8. The sliding pedestal 908 can still guide the flow of coolant through the fin array 914 using the bypass seal 200 which block the coolant from flowing past/bypassing the sliding pedestal 908.

Figure 15:
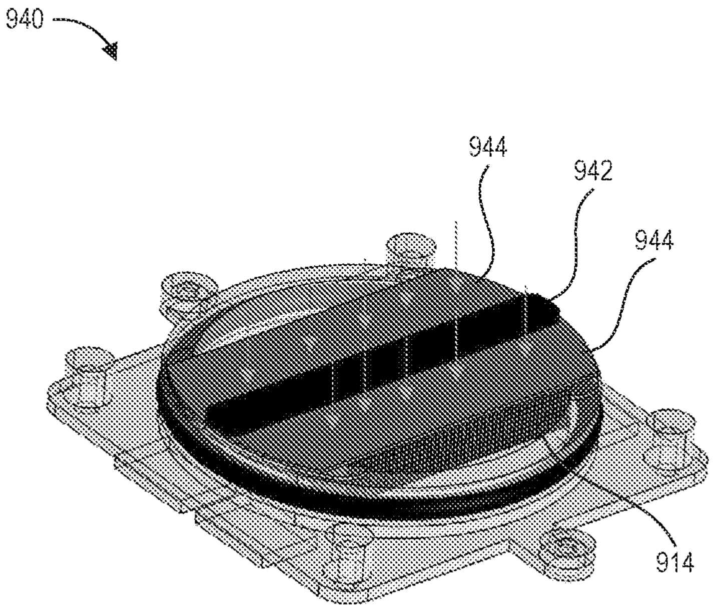
FIG. 15 illustrates another example sliding pedestal which can be coupled to the example manifold design in accordance with aspects of this disclosure.

FIG. 15 illustrates another example sliding pedestal 940 which can be coupled to the example manifold design in accordance with aspects of this disclosure. In this embodiment of FIG. 15, the sliding pedestal 940 includes a bypass foam 942 with pressure sensitive adhesives (PSA) 944 formed on both sides of the bypass foam 942. The bypass foam 942 may function similar to the bypass seal 920 of the sliding pedestal 908.

Because the bypass foam 942 does not cover the entirety of the fin array 914, there may be stagnant coolant above the PSA 944 that applies downward pressure. This pressure may result in a force of the electronic component 926. In contrast, by using the bypass seal 920 as shown in FIGS. 12A-14C, the coolant can be prevented from stagnating above the fin lid 916, thereby reducing the force applied to the electronic component 926 due to the coolant.

Figure 16A:
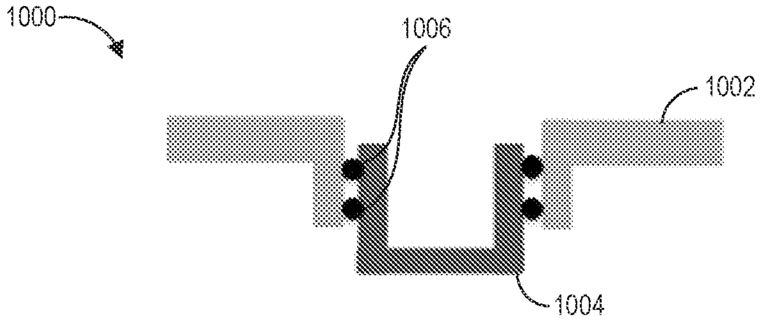
FIGS. 16A-16C illustrate different embodiments of seal configurations which can be employed in accordance with aspects of this disclosure.
Figure 16B:
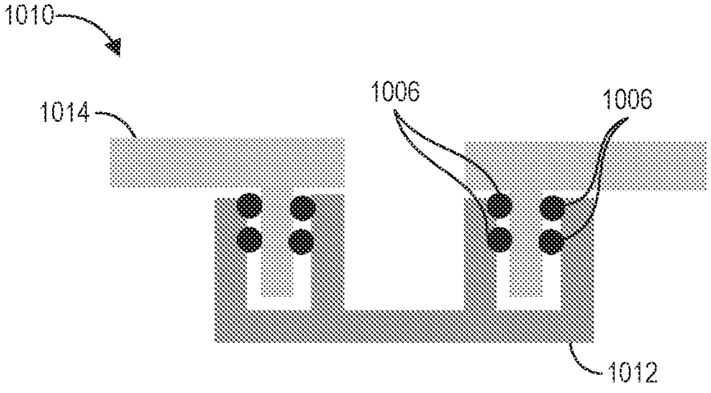
Figure 16C:
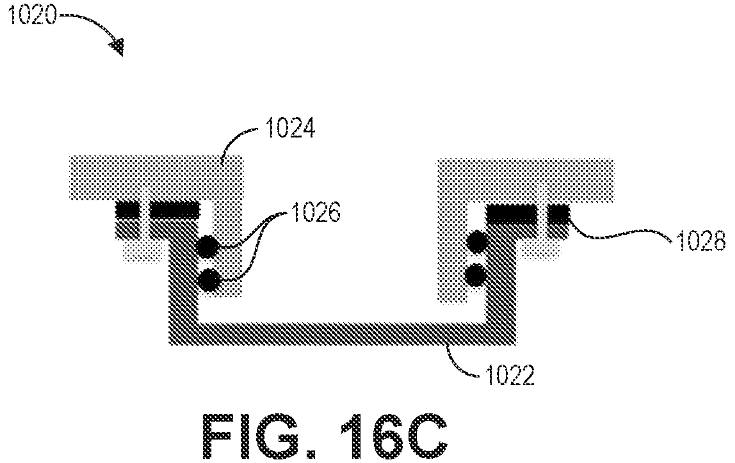

FIGS. 16A-16C illustrate different embodiments of seal configurations which can be employed in accordance with aspects of this disclosure. The seal configurations can be used in combination with any of the sliding pedestal configurations disclosed herein.

FIG. 16A illustrates a first configuration 1000 including a cylinder 1002 and a piston 1004 sealed by two radial seals provided by O-rings 1006. The cylinder 1002 may be formed on a manifold (e.g., the manifold 600 or 900) while the piston 1004 may be formed on a sliding pedestal (e.g., the sliding pedestal 410 or 908). The piston 1004 may include machined surfaces in which the O-rings 1006 are fitted to maintain the position of the O-rings 1006. The first configuration 1000 may generate a force on the electronic component 926 due to the force of the bypass seal 920 and the force of the coolant pressure.

FIG. 16B illustrates a second configuration 1010 including a cylinder 1002 and a piston 1014 sealed by four radial seals or O-rings 1016. As illustrated, two O-rings 1016 seal an inner diameter of the piston 1014 and two O-rings 1016 seal an outer diameter of the piston 1014. The cylinder 1012 may be formed on a manifold (e.g., the manifold 600 or 900) while the piston 1014 may be formed on a sliding pedestal (e.g., the sliding pedestal 410 or 908). The piston 1014 may include machined surfaces on both an inner diameter and an outer diameter of the piston 1014 in which the O-rings 1016 are fitted to maintain the position of the O-rings 1016. The second configuration 1010 may generate a force on the electronic component 926 due to the force of the bypass seal 920 and the force of the coolant pressure.

FIG. 16C illustrates a third configuration 1020 including a cylinder 1012 and a piston 1024 sealed by two radial seals or O-rings 1026 and a face seal 1028. The cylinder 1022 may be formed on a manifold (e.g., the manifold 600 or 900) while the piston 1024 may be formed on a sliding pedestal (e.g., the sliding pedestal 410 or 908). The piston 1024 may include machined surfaces in which the O-rings 1026 are fitted to maintain the position of the O-rings 1026 as well as the face seal 1028. The third configuration 1020 may add force to the electronic component 926 due to the face seal 1028. The face seal 1028 may be configured to have sufficient compression length to allow for sliding of the pedestal.

By using the sliding pedestal architectures described herein, the cold plate is able to act as both a flow distribution layer, providing coolant to the sliding pedestal(s) as well as an active cooling solution with high and low efficiency cooling channels. The high-efficiently cooling channels can be used to cool high-power processors (e.g., via the sliding pedestals), while lower power electronic components can be cooled using fixed gap pedestals.

In some implementations, a method of manufacturing the processing system can include providing a sliding pedestal over an integrated circuit (IC) die on a printed circuit board (PCB) with a thermal interface material (TIM) layer arranged over (e.g., attached to) the IC die, and attaching a spring loaded back plate to secure the sliding pedestal over the IC die. The sliding pedestal is configured to be spaced a variable distance in the first direction from the PCB. The method may also include providing O-rings at an inlet and an outlet of the sliding pedestal and connecting the inlet and the outlet of the sliding pedestal to a cold plate with the sliding pedestal arranged between the cold plate and the PCB.

CONCLUSION

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. Thus, the present disclosure is limited only by the claims.

In the foregoing specification, the disclosure has been described with reference to specific embodiments. However, as one skilled in the art will appreciate, various embodiments disclosed herein can be modified or otherwise implemented in various other ways without departing from the spirit and scope of the disclosure. Accordingly, this description is to be considered as illustrative and is for the purpose of teaching those skilled in the art the manner of making and using various embodiments of the disclosed air vent assembly. It is to be understood that the forms of disclosure herein shown and described are to be taken as representative embodiments. Equivalent elements, materials, processes or steps may be substituted for those representatively illustrated and described herein. Moreover, certain features of the disclosure may be utilized independently of the use of other features, all as would be apparent to one skilled in the art after having the benefit of this description of the disclosure. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

Further, various embodiments disclosed herein are to be taken in the illustrative and explanatory sense, and should in no way be construed as limiting of the present disclosure. All joinder references (e.g., attached, affixed, coupled, connected, and the like) are only used to aid the reader's understanding of the present disclosure, and may not create limitations, particularly as to the position, orientation, or use of the systems and/or methods disclosed herein. Therefore, joinder references, if any, are to be construed broadly. Moreover, such joinder references do not necessarily infer that two elements are directly connected to each other. Additionally, all numerical terms, such as, but not limited to, "first", "second", "third", "primary", "secondary", "main" or any other ordinary and/or numerical terms, should also be taken only as identifiers, to assist the reader's understanding of the various elements, embodiments, variations and/or modifications of the present disclosure, and may not create any limitations, particularly as to the order, or preference, of any element, embodiment, variation and/or modification relative to, or over, another element, embodiment, variation and/or modification.

It will also be appreciated that one or more of the elements depicted in the drawings/figures can also be implemented in a more separated or integrated manner, or even removed or rendered as inoperable in certain cases, as is useful in accordance with a particular application.

What is claimed is:

1. A processing system, comprising:

a first electronic component arranged over a printed circuit board (PCB), the first electronic component having a height in a first direction perpendicular to a major surface of the PCB;

a thermal interface material (TIM) layer arranged over the first electronic component;

a sliding pedestal arranged over the TIM layer, the sliding pedestal comprising an inlet, an outlet, and a coolant path between the inlet and the outlet; and a cold plate arranged over the sliding pedestal, the cold plate configured to cool a second electronic component and provide a coolant to the inlet of the sliding pedestal to cool the first electronic component via the sliding pedestal and the TIM layer as the coolant flows through the coolant path of the sliding pedestal, wherein the sliding pedestal is configured to move freely in the first direction while maintaining a fluid seal between the cold plate and each of the inlet and the outlet of the sliding pedestal.

2. The processing system of claim 1, wherein the sliding pedestal further comprises:

a fin array arranged between the inlet and the outlet and configured to provide heat transfer between the coolant and the first electronic component for cooling the first electronic component, wherein the processing system further comprises a pair of O-rings configured to maintain the fluid seal between the sliding pedestal and the cold plate as the sliding pedestal moves in the first direction.

3. The processing system of claim 1, further comprising a second PCB arranged over the cold plate, wherein the second electronic component is arranged between the second PCB and the cold plate, and wherein the second electronic component having a second height in the first direction.

4. The processing system of claim 3, wherein the cold plate comprises a fin array configured to cool the second electronic component.

5. The processing system of claim 3, further comprising:
a second sliding pedestal arranged between the cold plate and the second electronic component, wherein the second sliding pedestal is configured to move freely in the first direction.

6. The processing system of claim 1, wherein the first electronic component comprises a first processor chip, the processing system further comprising:
a second processor chip arranged over the PCB, the second processor chip having a second height in the first direction;
a second TIM layer arranged over the second processor chip; and
a second sliding pedestal arranged over the second TIM layer, wherein the second sliding pedestal is configured to move freely in the first direction.

7. The processing system of claim 6, wherein the cold plate comprises a manifold that defines a path through which the coolant is configured to flow, the manifold comprising:
an inlet configured to receive the coolant;
a split in the path configured to route the flow of the coolant into each of the sliding pedestal and the second sliding pedestal; and
an outlet through which the coolant is configured to exit the cold plate,
wherein the processing system further comprises:
a third electronic component arranged over the PCB; and
a third TIM layer arranged over the second electronic component,
wherein the cold plate further comprises a fixed gap pedestal arranged over the third TIM layer, and
wherein the manifold is further configured to direct the coolant to flow over the fixed gap pedestal so as to cool the second electronic component.

8. The processing system of claim 1, wherein the first electronic component comprises a first processor chip, the processing system further comprising:
a spring loaded back plate arranged below the PCB, the spring loaded back plate configured to pull the processor chip towards the PCB.

9. The processing system of claim 1, wherein the TIM is in contact with the first electronic component and the sliding pedestal.

10. The processing system of claim 1, wherein the sliding pedestal is configured to cool the first electronic component without cooling any other electronic components.

11. A processing system comprising:
a first electronic component arranged over a printed circuit board (PCB), the first electronic component having a height in a first direction perpendicular to a major surface of the PCB;
a thermal interface material (TIM) layer arranged over the first electronic component;
a sliding pedestal arranged over the TIM layer, wherein the sliding pedestal is configured to be spaced a variable distance in the first direction from the PCB, wherein the sliding pedestal comprises:
a pedestal body;
a fin array enclosed within the pedestal body; and
a bypass seal configured to guide flow of the coolant through the fin array; and
a cold plate arranged over the sliding pedestal, the cold plate configured to cool a second electronic component and provide a coolant to the sliding pedestal to cool the first electronic component via the sliding pedestal and the TIM layer as the coolant flows through a coolant path of the sliding pedestal.

12. The processing system of claim 11, wherein the sliding pedestal further comprises:
a fin lid configured to secure the fin array within the pedestal body; and
a pair of O-rings configured to seal the sliding pedestal to the cold plate.

13. The processing system of claim 11, wherein the cold plate comprises a cylinder configured to receive a portion of the sliding pedestal.

14. A system for cooling at least one integrated circuit die, comprising:
a sliding pedestal dimensioned to cover an integrated circuit die arranged over a printed circuit board (PCB), the sliding pedestal comprising an inlet to receive a coolant, an outlet to output the coolant, and a coolant path between the inlet and the outlet; and
a cold plate connectable with the sliding pedestal, the cold plate configured to provide the coolant to the sliding pedestal for cooling the integrated circuit die as the coolant flows through the coolant path of the sliding pedestal and to cool an electronic component,
wherein the sliding pedestal is configured to move freely in a first direction perpendicular to a major surface of the cold plate while maintaining a fluid seal between the cold plate and each of the inlet and the outlet of the sliding pedestal.

15. The system of claim 14, further comprising:
a second sliding pedestal dimensioned to cover a second integrated circuit die, the second sliding pedestal comprising an inlet to receive the coolant and an outlet to output the coolant, wherein the second sliding pedestal is configured to move freely in the first direction,
wherein the cold plate is further connectable with the second sliding pedestal, and the cold plate is further configured to provide the coolant to the second sliding pedestal for cooling the second integrated circuit die.

16. The system of claim 15, wherein the cold plate comprises:
a manifold that defines a path through which the coolant is configured to flow, the manifold comprising:
an inlet configured to receive the coolant,
a split in the path configured to route the flow of the coolant into each of the sliding pedestal and second sliding pedestal, and
an outlet through which the coolant is configured to exit the cold plate.

17. The system of claim 16, wherein the manifold further comprises fin structures configured to cool electronics on one or more printed circuit boards.

18. The system of claim 15, wherein the sliding pedestal and the second sliding pedestal are arranged on opposing sides of the cold plate.

19. The system of claim 15, wherein the sliding pedestal and the second sliding pedestal are arranged on a same side of the cold plate.

* * * * *